United States Patent
Ito et al.

(10) Patent No.: US 10,464,314 B2
(45) Date of Patent: Nov. 5, 2019

(54) LIQUID DISCHARGING APPARATUS AND CIRCUIT SUBSTRATE

(71) Applicant: SEIKO EPSON CORPORATION, Tokyo (JP)

(72) Inventors: Sukehiro Ito, Nagano (JP); Masashi Asakawa, Nagano (JP); Kazunori Hiramatsu, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/907,539

(22) Filed: Feb. 28, 2018

(65) Prior Publication Data

US 2018/0272696 A1 Sep. 27, 2018

(30) Foreign Application Priority Data

Mar. 22, 2017 (JP) .................. 2017-056643

(51) Int. Cl.
  *B41J 2/045* (2006.01)
  *B41J 2/15* (2006.01)
  *B41J 29/377* (2006.01)
  *H05K 1/02* (2006.01)

(52) U.S. Cl.
  CPC ......... *B41J 2/04515* (2013.01); *B41J 2/0458* (2013.01); *B41J 2/04541* (2013.01); *B41J 2/04548* (2013.01); *B41J 2/04581* (2013.01); *B41J 2/04588* (2013.01); *B41J 2/15* (2013.01); *B41J 29/377* (2013.01); *H05K 1/0203* (2013.01); *H05K 2201/066* (2013.01)

(58) Field of Classification Search
  CPC .................................................... B41J 29/377
  See application file for complete search history.

(56) References Cited

U.S. PATENT DOCUMENTS

| | | | | |
|---|---|---|---|---|
| 5,402,160 A | * | 3/1995 | Kadowaki | ............. B41J 29/377 165/104.33 |
| 5,437,041 A | * | 7/1995 | Wakabayashi | ............. B41J 5/44 361/712 |
| 5,461,705 A | * | 10/1995 | Wakabayashi | ............. B41J 5/44 358/1.14 |

(Continued)

FOREIGN PATENT DOCUMENTS

JP   2010-221500 A   10/2010

OTHER PUBLICATIONS

The Extended European Search Report for the corresponding European Patent Application No. 18160693.0 dated Aug. 20, 2018.

*Primary Examiner* — Julian D Huffman

(57) ABSTRACT

A liquid discharging apparatus includes a print head that has a driving element and discharges a liquid, a drive signal generation circuit that generates the drive signal based on a drive signal generation control signal for controlling generation of the drive signal, and a drive circuit substrate on which the drive signal generation circuit is provided. The drive circuit substrate has an input connector that inputs the drive signal generation control signal into the drive circuit substrate and an output connector that outputs the drive signal from the drive circuit substrate. A distance between the input connector and the output connector is shorter than a distance between the drive signal generation circuit and the input connector. The distance between the input connector and the output connector is shorter than a distance between the drive signal generation circuit and the output connector.

17 Claims, 16 Drawing Sheets

(56) References Cited

U.S. PATENT DOCUMENTS

| | | | | |
|---|---|---|---|---|
| 2004/0201639 | A1* | 10/2004 | Hayasaki | B41J 2/04541 347/12 |
| 2005/0264608 | A1* | 12/2005 | Hirayama | B41J 2/04541 347/54 |
| 2005/0264613 | A1* | 12/2005 | Hirayama | B41J 2/04541 347/58 |
| 2006/0152541 | A1* | 7/2006 | Isozaki | B41J 2/04528 347/17 |
| 2007/0121128 | A1* | 5/2007 | Silverbrook | B41J 2/14427 358/1.6 |
| 2016/0297221 | A1* | 10/2016 | Kitazawa | B41J 29/377 |
| 2016/0339690 | A1 | 11/2016 | Matsumoto | |
| 2018/0022085 | A1* | 1/2018 | Ishizaki | B41J 29/377 347/10 |
| 2018/0022127 | A1* | 1/2018 | Roure Pastor | B41J 29/00 347/9 |

* cited by examiner

| (SIH, SIL) | T1 | | T2 | |
|---|---|---|---|---|
| | Sa | Sb | Sa | Sb |
| (1, 1) [LARGE DOT] | H | L | H | L |
| (1, 0) [MEDIUM DOT] | H | L | L | H |
| (0, 1) [SMALL DOT] | L | L | L | H |
| (0, 0) [NON-RECORDING] | L | H | L | L |

LIQUID DISCHARGING APPARATUS AND CIRCUIT SUBSTRATE

BACKGROUND

1. Technical Field

The present invention relates to a liquid discharging apparatus and a circuit substrate.

2. Related Art

An apparatus using a piezoelectric element is known as a liquid discharging apparatus such as an ink jet printer that discharges inks and prints an image or characters. The piezoelectric element is provided so as to correspond to each of a plurality of nozzles in a head (print head), and each of the nozzles is driven in accordance with a drive signal. As a consequence, a predetermined amount of ink (liquid) is discharged at a predetermined timing from the nozzles, and thereby dots are formed. Since the piezoelectric element is a capacitive load like a capacitor from an electrical perspective, it is necessary to supply a sufficient amount of current in order to operate the piezoelectric element of each nozzle. For this reason, a configuration where a drive circuit supplies a drive signal amplified by an amplification circuit and the piezoelectric element is driven is adopted in the liquid discharging apparatus described above.

The layout of a circuit substrate on which a plurality of drive circuits that generate drive signals for driving a head are mounted is disclosed in JP-A-2010-221500.

In a liquid discharging apparatus such as an ink jet printer, the number of drive nozzles increases in accordance with an increase in printing speed and an increase in image quality, and the amount of heat generated in a drive circuit increases as well. For this reason, in a case where a plurality of drive circuits for generating drive signals are mounted on a circuit substrate as in the circuit substrate disclosed in JP-A-2010-221500, there is a possibility that the amount of heat generated in the circuit substrate further increases. In addition, since the heat generated in the drive circuit has an effect on not only the drive circuit itself but also a peripheral configuration, there is a possibility that discharge characteristics and the product life of a liquid discharging apparatus are also affected. For this reason, various cooling component are used in order to enhance cooling efficiency of the circuit substrate on which the drive circuit is mounted.

However, the layout of the circuit substrate for the cooling components to efficiently cool is not disclosed and there is a possibility that restriction of disposing the cooling components is generated due to the layout of the circuit substrate.

SUMMARY

An advantage of some aspects of the invention is to provide a liquid discharging apparatus and a circuit substrate, in which restriction of disposing cooling components is reduced and a high degree of freedom of disposing the cooling components is ensured on the circuit substrate on which a drive circuit is mounted.

The invention can be realized in the following aspects or application examples.

APPLICATION EXAMPLE 1

According to this application example, there is provided a liquid discharging apparatus including a print head that has a driving element and discharges a liquid when a drive signal is applied and the driving element is driven, a drive signal generation circuit that generates the drive signal based on a drive signal generation control signal for controlling generation of the drive signal, and a drive circuit substrate on which the drive signal generation circuit is provided. The drive circuit substrate has an input connector that inputs the drive signal generation control signal into the drive circuit substrate and an output connector that outputs the drive signal from the drive circuit substrate. A distance between the input connector and the output connector is shorter than a distance between the drive signal generation circuit and the input connector. The distance between the input connector and the output connector is shorter than a distance between the drive signal generation circuit and the output connector.

The driving element may be, for example, a piezoelectric element, or may be a heater element.

In the liquid discharging apparatus according to this application example, the distance between the input connector and the output connector is shorter than the distance between both of the input connector and the output connector and the drive signal generation circuit, on the drive circuit substrate that generates a drive signal. That is, a region where the input connector and the output connector are disposed and a region where the drive signal generation circuit generating heat is disposed are disposed in different regions on the drive circuit substrate. Accordingly, it is possible to dispose a cooling component for cooling the heat generating drive signal generation circuit without being restricted by any of the input connector which inputs a signal into the drive signal generation circuit and the output connector which outputs a signal from the drive signal generation circuit. Therefore, it is possible to provide the liquid discharging apparatus, in which restriction of disposing the cooling component is reduced and a high degree of freedom of disposing the cooling component is ensured.

It is possible to optimally dispose the cooling component on the drive signal generation circuit, and it is possible to efficiently cool a heat generating component. It is possible to reduce an effect of heat generated in the drive signal generation circuit on a peripheral configuration. Therefore, an effect on the discharge characteristics and the product life of the liquid discharging apparatus can be reduced.

APPLICATION EXAMPLE 2

In the liquid discharging apparatus according to the application example, a fan may be further included. The fan may be provided at a position intersecting a direction where a plane of the drive circuit substrate extends. A distance between the fan and the drive signal generation circuit may be shorter than a distance between the fan and the input connector. The distance between the fan and the drive signal generation circuit may be shorter than a distance between the fan and the output connector.

In the liquid discharging apparatus according to the application example, the fan is included as a cooling device, and the fan is provided on a side of the drive circuit substrate where the drive signal generation circuit is provided. Accordingly, it is possible for the fan to efficiently cool the drive signal generation circuit without being affected by the disposition of the input connector and the output connector.

In the liquid discharging apparatus according to the application example, the fan is provided so as to intersect the direction where the plane of the drive circuit substrate extends. That is, it is possible to selectively cool both of or one of the front side and the back side of the drive circuit substrate. Therefore, it is possible to efficiently cool the drive circuit substrate.

APPLICATION EXAMPLE 3

In the liquid discharging apparatus according to the application example, a drive circuit accommodating unit that accommodates the drive circuit substrate and has an opening may be further included. The opening may be provided at a position intersecting a direction where a plane of the drive circuit substrate extends. A distance between the opening and the drive signal generation circuit may be shorter than a distance between the opening and the input connector. The distance between the opening and the drive signal generation circuit may be shorter than a distance between the opening and the output connector.

In the liquid discharging apparatus according to the application example, the drive circuit substrate may be accommodated in the case having the opening. The sticking of a liquid discharged from the print head to the drive circuit substrate can be reduced by the case accommodating the drive circuit substrate. Therefore, on the drive circuit substrate, the occurrence of a defect such as an insulation failure caused by a liquid discharged from the print head is reduced.

In the liquid discharging apparatus according to the application example, the opening of the case is provided on a drive signal generation circuit side so as to intersect the direction where the plane of the drive circuit substrate extends. That is, heat generated in the drive signal generation circuit is unlikely to stay in the case and is discharged to the outside of the case from the opening. Therefore, it is possible to efficiently cool the drive signal generation circuit.

APPLICATION EXAMPLE 4

In the liquid discharging apparatus according to the application example, a radiator may be further included. The radiator may be provided on a surface of the drive circuit substrate, which is different from a surface on which the drive signal generation circuit is provided. In planar view of the drive circuit substrate, the drive signal generation circuit and the radiator may be provided at positions where at least a part of the drive signal generation circuit and a part of the radiator overlap each other.

In the liquid discharging apparatus according to the application example, the radiator is included as a cooling device and the radiator is provided on the surface of the drive circuit substrate, which is different from the surface of the drive signal generation circuit, and is provided so as to overlap the drive signal generation circuit. That is, it is possible for the radiator to dissipate heat generated in the drive signal generation circuit from the surface of the drive circuit substrate on which the drive signal generation circuit is not provided. Accordingly, it is possible to dissipate heat generated in the drive signal generation circuit.

APPLICATION EXAMPLE 5

In the liquid discharging apparatus according to the application example, the drive signal generation control signal may be a digital signal, the drive signal generation circuit may generate an underlying drive signal, which is an underlying analog signal of the drive signal, based on the drive signal generation control signal, and the drive signal generation circuit may power-amplify the underlying drive signal to generate the drive signal.

In the liquid discharging apparatus according to the application example, the drive signal generation control signal input into the drive signal generation circuit is input as a digital signal. That is, the drive signal generation control signal, which is an underlying signal of the drive signal, is unlikely to receive an effect of external noises. Thus, the drive signal generation control signal is accurately input into the drive signal generation circuit. Therefore, there is a possibility that the accuracy of the drive signal output from the drive signal generation circuit improves.

In the liquid discharging apparatus according to the application example, the drive signal generation control signal input into the drive signal generation circuit may be input as a differential signal. Accordingly, it is possible to reduce an effect of external noises (in particular, common mode noises) on the drive signal generation control signal input into the drive signal generation circuit. Thus, the drive signal generation control signal is accurately input into the drive signal generation circuit. Therefore, there is a possibility that the accuracy of the drive signal output from the drive signal generation circuit improves.

APPLICATION EXAMPLE 6

According to this application example, there is provided a circuit substrate including a drive signal generation circuit that generates a drive signal for driving a driving element based on a drive signal generation control signal, an input connector that inputs the drive signal generation control signal, and an output connector that outputs the drive signal. A distance between the input connector and the output connector is shorter than a distance between the drive signal generation circuit and the input connector. The distance between the input connector and the output connector is shorter than a distance between the drive signal generation circuit and the output connector.

In the circuit substrate according to this application example, the distance between the input connector and the output connector is shorter than the distance between both of the input connector and the output connector and the drive signal generation circuit, on the drive circuit substrate that generates a drive signal. That is, the region where the input connector and the output connector are disposed and the region where the drive signal generation circuit generating heat is disposed are disposed in different regions. Accordingly, it is possible to dispose a cooling component for cooling the heat generating drive signal generation circuit without being restricted by any of the input connector which inputs a signal into the drive signal generation circuit and the output connector which outputs a signal from the drive signal generation circuit. Therefore, it is possible to provide the liquid discharging apparatus, in which restriction of disposing the cooling component is reduced and a high degree of freedom of disposing the cooling component is ensured.

By the cooling component of the drive signal generation circuit efficiently performing cooling, it is possible to reduce an effect of heat generated in the drive signal generation circuit on a peripheral configuration and an effect on discharge characteristics and the product life of the liquid discharging apparatus can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, suitable embodiments of the invention will be described in detail with reference to the drawings. The referred drawings are for the convenience of description. The embodiments to be described below do not wrongfully limit the content of the invention described in the scope of claims. Not all configurations described below are essential configuration requirements.

1 First Embodiment 1.1 Outline of Liquid Discharging Apparatus

A printing apparatus, which is an example of a liquid discharging apparatus according to a first embodiment, is an ink jet printer that forms ink dot groups onto a printing medium, such as paper, by discharging inks according to image data supplied from an external host computer and thereby prints an image (including characters and figures) corresponding to the image data.

In addition to the printing apparatus such as a printer, a color material discharging apparatus used in manufacturing color filters, such as a liquid crystal display, an electrode material discharging apparatus used in forming electrodes such as an organic EL display and a field emission display (FED), a bioorganic material discharging apparatus used in manufacturing biochips, a three-dimensional modelling apparatus (so-called 3D printer), and a textile printing apparatus can be given as examples of the liquid discharging apparatus.

Figure 1:
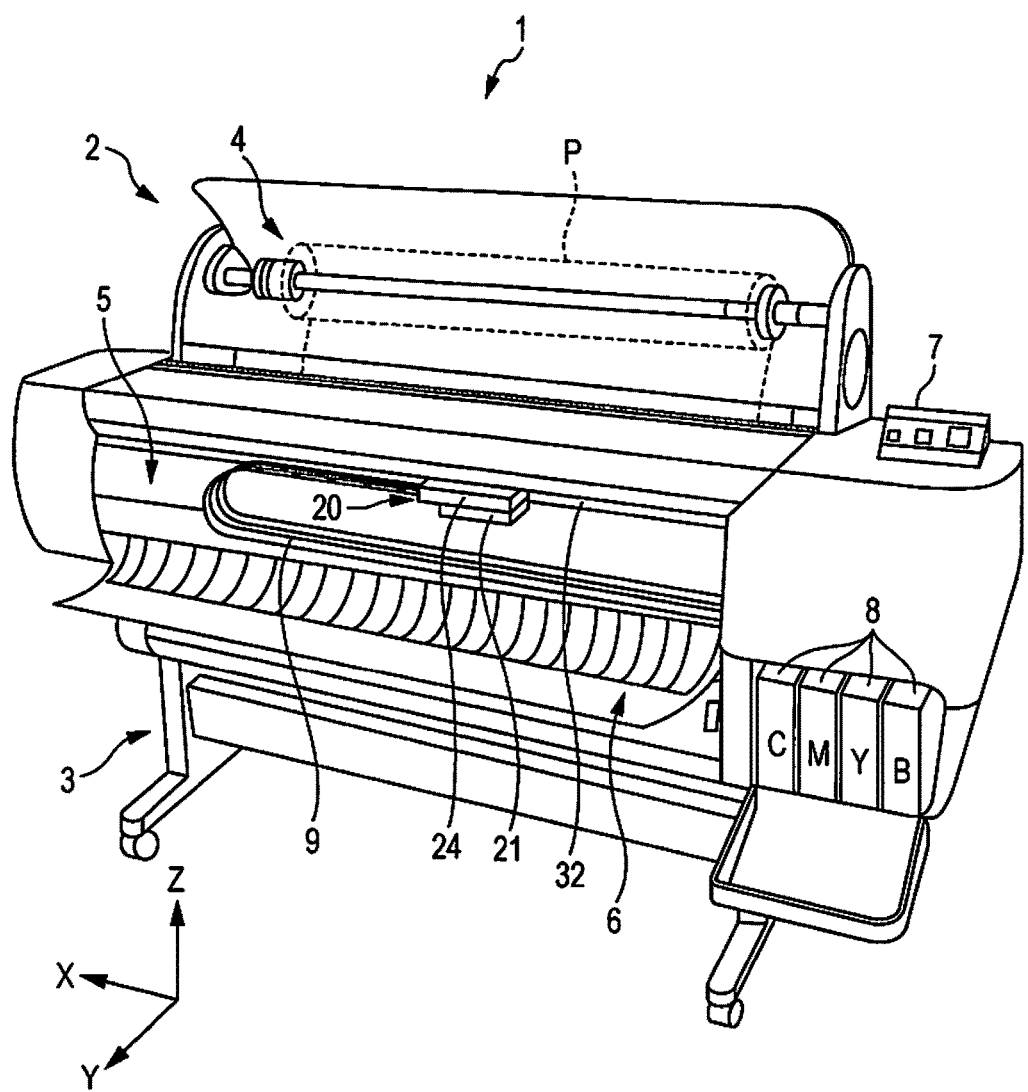
FIG. 1 is a schematic view illustrating an appearance of a liquid discharging apparatus.

FIG. 1 is a schematic view illustrating an appearance of a liquid discharging apparatus 1. As illustrated in FIG. 1, the liquid discharging apparatus 1 is a serial scan type (serial printing type) large format printer, and includes a main body 2 and a support stand 3 that supports the main body 2. The large format printer is, for example, a printer that corresponds to the size of paper having an A3 short side width (297 mm×420 mm) or longer, which is a printable size of a printing medium, and the large format printer in the first embodiment is a so-called large format printer (LFP) of which maximum printable size of a printing medium P is approximately 70 inches. In the first embodiment, in FIG. 1, a moving direction of a carriage 24 of the liquid discharging apparatus 1 will be referred to as a main scanning direction X, a transporting direction of the printing medium P of the liquid discharging apparatus 1 will be referred to as a sub-scanning direction Y, and a vertical direction of the liquid discharging apparatus 1 will be referred to as a vertical direction Z. Although the main scanning direction X, the sub-scanning direction Y, and the vertical direction Z are illustrated as three axes of X, Y, and Z, which are orthogonal to each other, in the drawings, a disposition relationship of each unit is not necessarily limited to being orthogonal to each other.

As illustrated in FIG. 1, the main body 2 includes a supplying unit 4 that supplies the printing medium (rolled paper) P, a printing unit 5 that discharges ink droplets onto the printing medium P to perform printing onto the printing medium P, a sending-out unit 6 that sends the printing medium P printed by the printing unit 5 out from the main body 2, an operation unit 7 that performs operation of execution and stop of printing, and an ink storing unit 8 that stores an ink (liquid) to be discharged. Although not illustrated, a USB port and a power supply port are provided in the rear surface of the liquid discharging apparatus 1. That is, the liquid discharging apparatus 1 is configured so as to be connectable to a computer via a USB port.

The printing unit 5 is configured so as to include a head unit 20, a carriage guide shaft 32, and an ink tube 9.

The head unit 20 is configured so as to include the carriage 24 and a head 21 that is mounted on the carriage 24 so as to oppose the printing medium (rolled paper) P. The head 21 is a liquid ejecting head for discharging ink droplets (liquid droplets) from multiple nozzles. In addition, the carriage 24 is supported by the carriage guide shaft 32 and moves (reciprocates) in the main scanning direction X. At this time, the printing medium P is transported in the sub-scanning direction Y. That is, the liquid discharging apparatus 1 in the first embodiment performs serial printing, in which the head unit 20, including the carriage 24 on which the head 21 discharging ink droplets (liquid) is mounted, moves (reciprocates) and prints in the main scanning direction X.

A plurality of ink cartridges 22 are attached to the ink storing unit 8, and each of the ink cartridges 22 is filled with an ink having a corresponding color. Although the four ink cartridges 22 corresponding to four colors such as cyan (C), magenta (M), yellow (Y), and black (B) are illustrated in FIG. 1, the ink cartridges 22 are not limited to this configuration. For example, four or more ink cartridges 22 may be included, or the ink cartridges 22 for different colors such as gray, green, and violet may be configured to be included. An ink accommodated in each of the ink cartridges 22 is supplied to the head 21 via the ink tube 9.

1.2 Electrical Configuration of Liquid Discharging Apparatus

Figure 2:
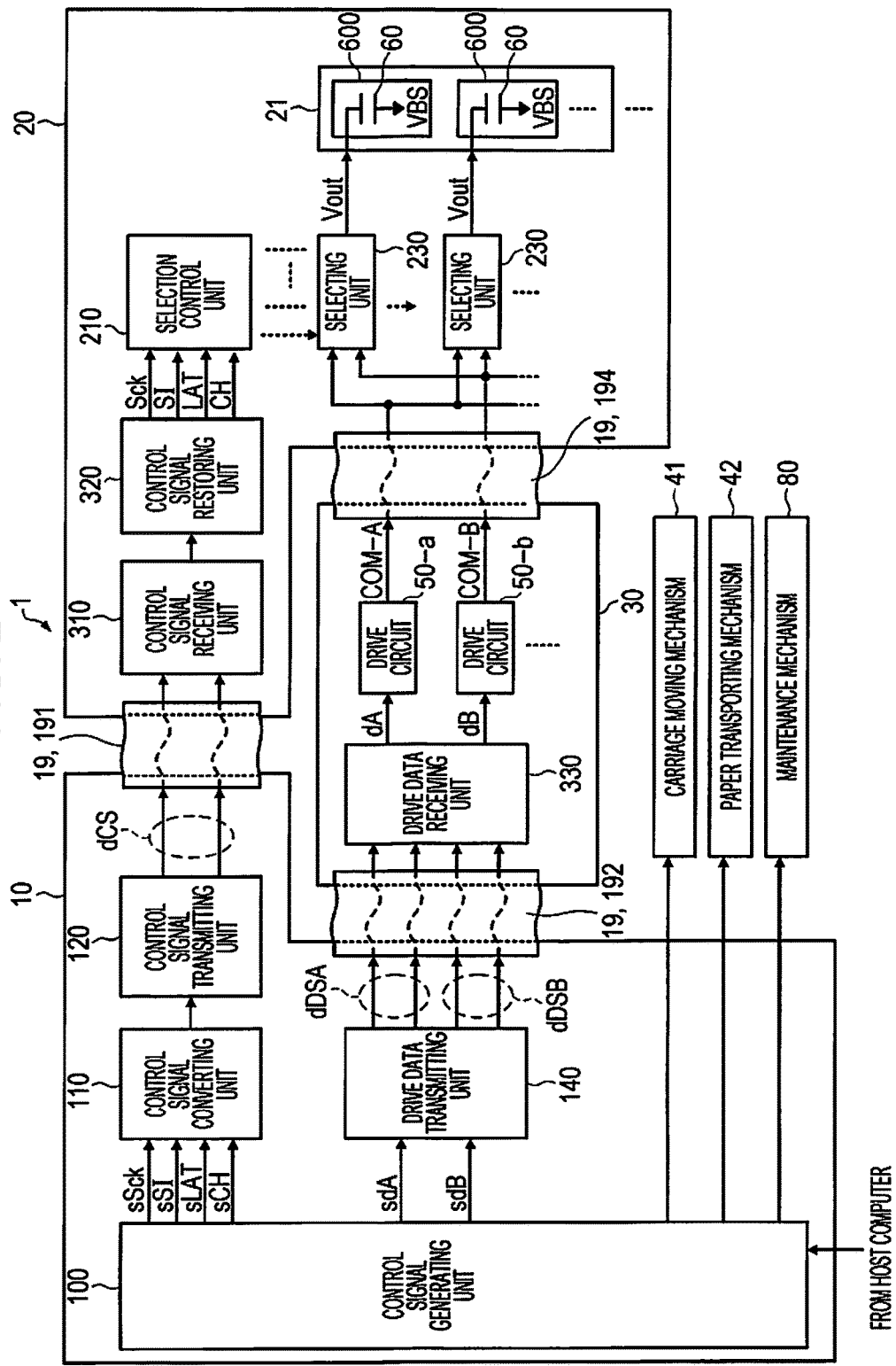
FIG. 2 is a block diagram showing an electrical configuration of the liquid discharging apparatus.

FIG. 2 is a block diagram showing an electrical configuration of the liquid discharging apparatus 1 of the first embodiment.

As shown in FIG. 2, the liquid discharging apparatus 1 includes a control unit 10 that controls discharging of a liquid, the head unit 20 that has discharging units 600 which discharge liquids, a drive unit 30 that generates a drive signal, and a plurality of cables 19 connecting these configurations together. Although the liquid discharging apparatus 1 may be configured so as to include a plurality of head units 20, one head unit 20 represents the plurality of head units in FIG. 2.

The control unit 10 is configured so as to include a control signal generating unit 100, a control signal converting unit 110, a control signal transmitting unit 120, and a drive data transmitting unit 140.

The control signal generating unit 100 outputs various types of control signals for controlling each unit when various types of signals, such as image data, are supplied from the host computer. Specifically, the control signal generating unit 100 generates a control signal for controlling a carriage moving mechanism 41 and a control signal for controlling a paper transporting mechanism 42. The carriage moving mechanism 41 moves (reciprocates) the carriage 24 in the main scanning direction X, for example, by controlling the rotation of a motor for moving the carriage 24. In addition, the paper transporting mechanism 42 supports, for example, the continuous printing medium P, which is wound in a roll shape, so as to be rotatable, and transports the printing medium P by rotation. That is, by the carriage moving mechanism 41 and the paper transporting mechanism 42 operating based on control signals from the control signal generating unit 100, it is possible to perform printing at a predetermined position on the printing medium P.

The control signal generating unit 100 generates a control signal for causing a maintenance mechanism 80 to execute maintenance processing for returning ink discharge states of the discharging units 600 to normal. Based on the control signal from the control signal generating unit 100, the maintenance mechanism 80 performs cleaning processing (pumping processing), in which thickened inks and bubbles in the discharging units 600 are suctioned by a tube pump (not illustrated), and wiping processing, in which foreign substances, such as paper dust stuck around nozzles of the discharging units 600, are wiped off by a wiper, as maintenance processing.

The control signal generating unit 100 generates an original clock signal sSck, an original print data signal sSI, an original latch signal sLAT, and an original change signal sCH, based on various types of signals from the host computer, as a plurality of types of original control signals for controlling the discharging of liquids from the discharging units 600, and outputs the signals to the control signal converting unit 110 in a parallel format. In the plurality of types of original control signals, some of the signals may not be included, or other signals may be included.

In addition, the control signal generating unit 100 generates original drive data pieces sdA and sdB, which are data pieces indicating drive signals for driving the discharging units 600 included in the head unit 20, based on various types of signals from the host computer, and outputs the data pieces to the drive data transmitting unit 140 in a parallel format. For example, the original drive data pieces sdA and sdB may be digital data pieces obtained by converting the waveforms (drive waveforms) of drive signals from analog to digital, may be digital data pieces that define a corresponding relationship between a length and a slope of each section where a slope is constant in a drive waveform, or may be digital data pieces in which one of a plurality of types of drive waveforms stored in a memory unit (not illustrated) is selected.

The control signal converting unit 110 converts (serializes) the plurality of types of original control signals (the original clock signal sSck, the original print data signal sSI, the original latch signal SLAT, and the original change signal sCH) output from the control signal generating unit 100 to a serial control signal in one serial format, and outputs the signal to the control signal transmitting unit 120. The control signal converting unit 110 generates a clock signal for transmission used in high-speed serial data transmission via the cable 19, and incorporates the clock signal for transmission into the serial control signal along with the plurality of types of original control signals.

The control signal transmitting unit 120 converts the serial control signal output from the control signal converting unit 110 to original control differential signals dCS, and transmits the signals to the head unit 20 via the cable 19. The cable 19 through which the original control differential signals dCS output from the control signal transmitting unit 120 are transmitted will be referred to as an FFC 191.

For example, the control signal transmitting unit 120 converts the serial control signal to differential signals in a low voltage differential signaling (LVDS) transmission mode and outputs the signals to the head unit 20. Since the amplitudes of the differential signals in the LVDS transmission mode are approximately 350 mV, high-speed data transmission can be realized. The control signal transmitting unit 120 may transmit differential signals in various types of high-speed transmission modes other than LVDS, such as low voltage positive emitter coupled logic (LVPECL) and current mode logic (CML), to the head unit 20. The control signal transmitting unit 120 may independently transmit a clock signal for transmission to the head unit 20 without the control signal converting unit 110 incorporating the clock signal for transmission into a serial control signal.

The drive data transmitting unit 140 converts the original drive data pieces sdA and sdB output from the control signal generating unit 100 to original drive differential signals dDSA and dDSB respectively (examples of a "drive signal generation control signal"), which are digital signals in a serial format, and transmits the data to the drive unit 30 via the cable 19. The cable 19 through which the original drive differential signals dDSA and dDSB output from the drive data transmitting unit 140 included in the control unit 10 are transmitted will be referred to as an FFC 192.

For example, the original drive differential signals dDSA and dDSB output from the drive data transmitting unit 140 are digital signals. Specifically, the drive data transmitting unit 140 may convert each of the original drive data pieces sdA and sdB to a differential signal in a high-speed transmission mode such as LVDS and transmit the signals to the head unit 20. The drive data transmitting unit 140 may serialize the original drive data pieces sdA and sdB to one serial signal in a serial format, and convert the serial signal to the original drive differential signals dDSA and dDSB to transmit the signal to the head unit 20. The drive data transmitting unit 140 may incorporate a clock signal for transmission used in high-speed serial data transmission into a differential signal, or may independently transmit the clock signal for transmission to the head unit 20.

The drive unit 30 is configured so as to include a drive data receiving unit 330 and drive circuits 50-$a$ and 50-$b$.

The drive data receiving unit 330 receives the original drive differential signals dDSA and dDSB transmitted from the control unit 10, and outputs drive data pieces dA and dB, which are data pieces indicating drive signals for driving the discharging units 600 provided in the head unit 20. Specifically, the drive data receiving unit 330 differential-amplifies the received original drive differential signals dDSA and dDSB, restores a clock signal for transmission incorporated in the differential-amplified signal, and outputs the drive data pieces dA and dB in a parallel format by restoring the original drive data pieces sdA and sdB included in the differential-amplified signal based on the clock signal for transmission.

The drive circuits 50-a and 50-b (examples of a "drive signal generation circuit") generate drive signals COM-A and COM-B for driving each of the discharging units 600 provided in the head unit 20 based on the drive data pieces dA and dB output from the drive data receiving unit 330.

For example, if the drive data pieces dA and dB are digital data pieces obtained by converting the waveforms of the drive signals COM-A and COM-B, respectively, from analog to digital, the drive circuits 50-a and 50-b generate analog signals obtained by converting the drive data pieces dA and dB, respectively, from digital to analog, and after then, amplify the signals with a class D amplifier to generate the drive signals COM-A and COM-B.

For example, if each of the drive data pieces dA and dB is digital data that defines a corresponding relationship between a length and a slope of each section of which slope is constant in each of the waveforms of the drive signals COM-A and COM-B, each of the drive circuits 50-a and 50-b generates an analog signal that satisfies the corresponding relationship between a length and a slop of each section defined by each of the drive data pieces dA and dB and amplifies the signal with a class D amplifier to generate the drive signals COM-A and COM-B.

For example, if each of the drive data pieces dA and dB is digital data in which one of a plurality of types of drive waveforms stored in the memory unit (not illustrated) is selected, each of the drive circuits 50-a and 50-b generates an analog signal selected in each of the read drive data pieces dA and dB and amplifies the signal with a class D amplifier to generate the drive signals COM-A and COM-B.

As described above, the drive data pieces dA and dB are data pieces defining the waveforms of the drive signals COM-A and COM-B, respectively. The drive signals COM-A and COM-B generated by the drive circuits 50-a and 50-b are transmitted to the head unit 20 via the cable 19. The cable 19 through which the drive signals COM-A and COM-B are transmitted to the head unit 20 will be referred to as an FFC 194. The drive circuits 50-a and 50-b are different only in terms of data to be input and a drive signal to be output, and may have the same circuit configuration. Although the plurality of drive circuits 50-a and 50-b may be included in the drive unit 30, a pair of drive circuits 50-a and 50-b represents the plurality of drive circuits in FIG. 2.

The head unit 20 has a control signal receiving unit 310, a control signal restoring unit 320, a selection control unit 210, a plurality of selecting units 230, and the head 21. Although only one head 21 is shown in FIG. 2, the head unit 20 of the first embodiment may include a plurality of heads 21.

The control signal receiving unit 310 receives the original control differential signals dCS transmitted from the control unit 10 via the FFC 191 and converts the received original control differential signals dCS to a serial control signal to output to the control signal restoring unit 320. Specifically, the control signal receiving unit 310 may receive differential signals in the LVDS transmission mode and differential-amplify the differential signals to convert to a serial control signal.

The control signal restoring unit 320 generates a plurality of types of control signals (a clock signal Sck, a print data signal SI, a latch signal LAT, and a change signal CH) for controlling the discharging of liquids from the discharging units 600 based on the serial control signal converted by the control signal receiving unit 310. Specifically, the control signal restoring unit 320 restores the clock signal for transmission incorporated in the serial control signal output from the control signal receiving unit 310, and restores (deserializes) the plurality of types of original control signals (the original clock signal sSck, the original print data signal sSI, the original latch signal sLAT, and the original change signal sCH) included in the serial control signal based on the clock signal for transmission to generate the plurality of types of control signals (the clock signal Sck, the print data signal SI, the latch signal LAT, and the change signal CH) in a parallel format.

The selection control unit 210 instructs each of the selecting units 230 of which signal should be selected from the drive signals COM-A and COM-B (or neither of the signals should be selected) by mean of the plurality of types of control signals (the clock signal Sck, the print data signal SI, the latch signal LAT, and the change signal CH).

Each of the selecting units 230 selects from the drive signals COM-A and COM-B in accordance with an instruction from the selection control unit 210, and supplies the signal to one end of each of the piezoelectric elements 60 included in the head 21 (an example of a "print head") as a drive signal Vout. A voltage VBS is commonly applied to the other end of each of the piezoelectric elements 60.

The piezoelectric elements 60 (examples of a "driving element") are displaced when drive signals are applied thereto. Each of the piezoelectric elements 60 is provided so as to correspond to each of the plurality of discharging units 600 in the head 21. The piezoelectric elements 60 are displaced according to a difference between the drive signal Vout and the voltage VBS selected by the selecting units 230 to discharge inks.

1.3 Configuration of Printing Head
1.3.1 Configuration of Discharging Unit

Herein, a configuration for discharging inks by driving of the piezoelectric elements 60 will be briefly described.

Figure 3:
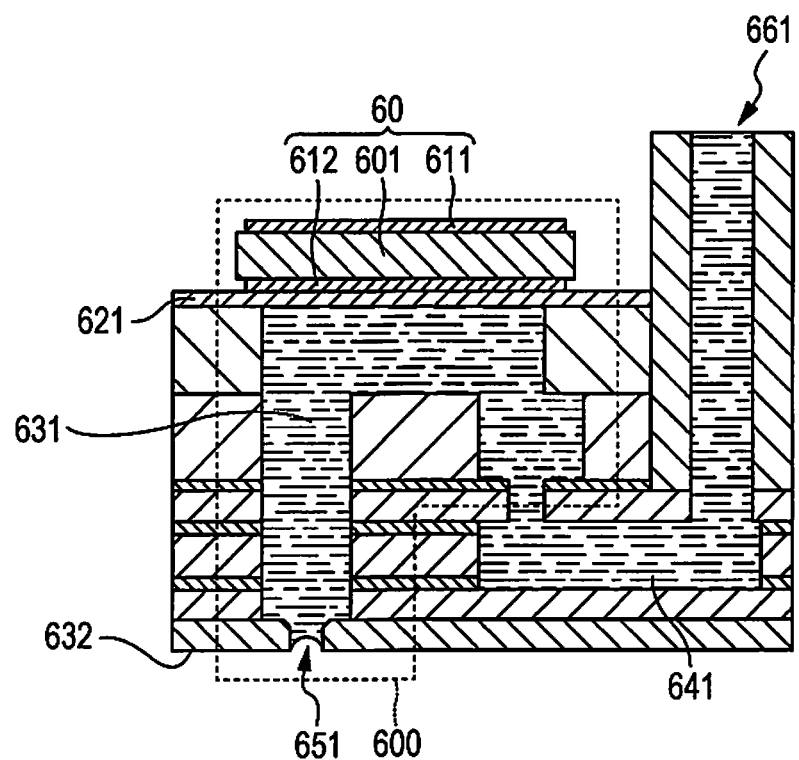
FIG. 3 is a view illustrating a schematic configuration corresponding to one discharging unit of a head.

FIG. 3 is a view illustrating a schematic configuration corresponding to one discharging unit 600 in the head 21. As illustrated in FIG. 3, the head 21 includes the discharging unit 600 and a reservoir 641.

The reservoir 641 is provided for each color of ink, and an ink is introduced from a supply port 661 to the reservoir 641. An ink is supplied from each of the ink cartridges 22 provided in the ink storing unit 8 to the supply port 661 via an ink tube.

Each of the discharging units 600 includes the piezoelectric element 60, a vibrating plate 621, a cavity (pressure chamber) 631, and the nozzle 651. The vibrating plate 621 is displaced (bending vibration) by the piezoelectric element 60 provided at the top in FIG. 3, and functions as a diaphragm that increases/decreases the internal volume of the cavity 631 filled with an ink. The nozzle 651 is provided in the nozzle plate 632 and is an opening portion that communicates with the cavity 631. The cavity 631 is filled with a liquid (for example, an ink), and the internal volume of the cavity changes due to the displacement of the piezoelectric element 60. The nozzle 651 communicates with the cavity 631 and discharges the liquid in the cavity 631 as liquid droplets according to the change in the internal volume of the cavity 631.

The piezoelectric element 60 illustrated in FIG. 3 has a structure in which a piezoelectric body 601 is sandwiched between a pair of electrodes 611 and 612. A middle portion of the piezoelectric body 601 having this structure bends in an up-and-down direction with the electrodes 611 and 612 and the vibrating plate 621 with respect to both end portions in FIG. 3 according to a voltage applied by the electrodes 611 and 612. Specifically, when the voltage of the drive signal Vout becomes higher, the piezoelectric element 60 bends upwards, and when the voltage of the drive signal Vout becomes lower, the piezoelectric element bends downwards. In this configuration, since the internal volume of the cavity 631 increases when the piezoelectric element bends upwards, an ink is drawn into the reservoir 641. On the other hand, since the internal volume of the cavity 631 decreases when the piezoelectric element bends downwards, an ink is discharged from the nozzle 651 depending on the degree of decrease.

Without being limited to the illustrated structure, each of the piezoelectric elements 60 may be in any form in which the piezoelectric element 60 is deformed and a liquid such as an ink can be discharged. In addition, without being limited to bending vibration, each of the piezoelectric elements 60 may have a configuration where a so-called longitudinal vibration is used.

In addition, each of the piezoelectric elements 60 is provided so as to correspond to the cavity 631 and the nozzle 651 in the head 21, and is provided so as to correspond to the selecting unit 230 as well. For this reason, a set of the piezoelectric element 60, the cavity 631, the nozzle 651, and the selecting unit 230 is provided for each nozzle 651.

1.3.2 Configuration of Drive Signal

Figure 4:
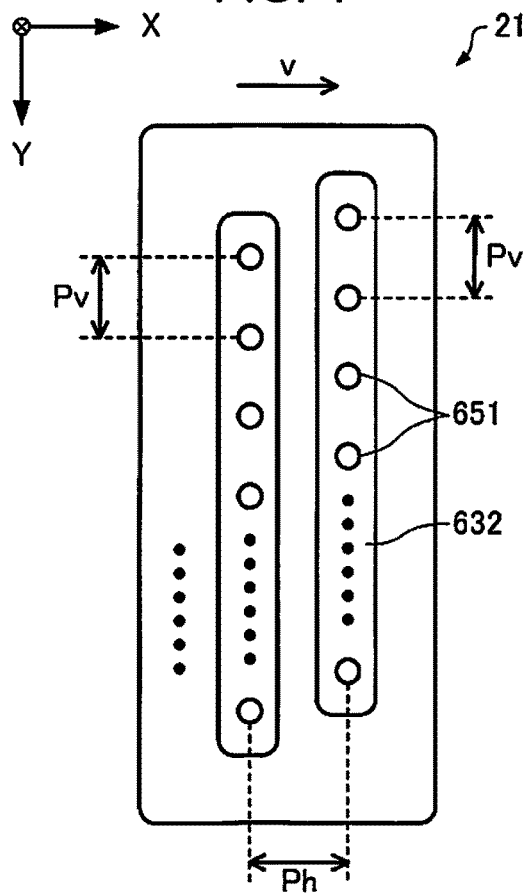
FIG. 4 is a view illustrating an example of array of nozzles.

FIG. 4 is a view illustrating an example of the array of the nozzles 651. As illustrated in FIG. 4, the nozzles 651 are arrayed, for example, in two rows, as follows. Specifically, as for nozzles in one row, the plurality of nozzles 651 are disposed at a pitch Pv in the sub-scanning direction Y. Two rows of nozzles are spaced away from one another at a pitch Ph in the main scanning direction X. The first row nozzle and the second row nozzle are in a relationship of being shifted away from each other at half the pitch Pv in the sub-scanning direction Y.

Although the nozzles 651 are provided in a pattern corresponding to each color of the ink cartridges 22 to be used (for example, cyan (C), magenta (M), yellow (Y), and black (B)), for example, in the main scanning direction X, a case where gradations are expressed with a single color will be described to simplify the following description.

Figure 5:
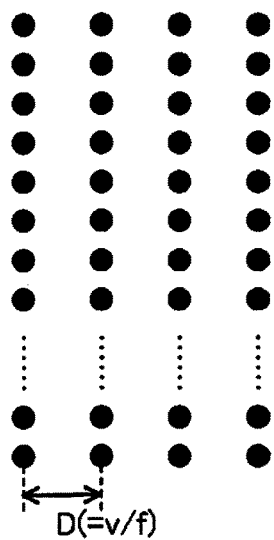
FIG. 5 is a view for illustrating basic resolution of image formation by nozzle array.

FIG. 5 is a view for illustrating basic resolution of image formation by the nozzle array illustrated in FIG. 4. To simplify description, FIG. 5 is an example of a method (first method), in which the nozzles 651 discharge ink droplets one time to form one dot, and black circles indicate dots formed by landing of ink droplets.

When the head unit 20 moves in the main scanning direction X at a speed v, a dot interval D (in the main scanning direction X) between dots formed by landing of ink droplets as illustrated in FIG. 5 and the speed v are in a relationship as follows.

That is, in a case where one dot is formed by one time of discharging of ink droplets, the dot interval D is a value (=v/f) obtained by dividing the speed v by an ink discharge frequency f, in other words, is a distance by which the head unit 20 moves in a period (1/f) when ink droplets are repeatedly discharged.

In examples illustrated in FIGS. 4 and 5, a relationship of the pitch Ph being proportional to the dot interval D by a coefficient n is established, such that ink droplets discharged by the two rows of nozzles 651 land in the same rows on the printing medium P. For this reason, as illustrated in FIG. 5, a dot interval in the sub-scanning direction Y is half a dot interval in the main scanning direction X. The array of dots is not limited to the illustrated example.

High-speed printing is realized simply by increasing the speed v at which the head unit 20 moves in the main scanning direction X. However, simply increasing the speed v makes the dot interval D longer. For this reason, it is necessary to increase the number of dots formed per unit time by increasing the ink discharge frequency f in order to realize high-speed printing with a certain degree of resolution being ensured.

Apart from a printing speed, the number of dots formed per unit area may be increased in order to increase resolution. However, in a case of increasing the number of dots, dots adjacent to each other combine together if the used amount of ink is not small, and a printing speed declines if the ink discharge frequency f is not increased.

As described above, it is necessary to increase the ink discharge frequency f in order to realize high-speed printing and high-resolution printing.

In addition to a method of forming one dot by discharging ink droplets one time, there are a method of forming one dot (second method) by discharging ink droplets two or more times per unit time, landing one or more ink droplets discharged per unit time, and combining one or more landed ink droplets and a method of forming two or more dots (third method) without combining the two or more ink droplets, as a method of forming a dot onto the printing medium P. In the first embodiment, according to the second method, four gradations of a "large dot", a "medium dot", a "small dot", and a "non-recording (no dot)" are expressed for one dot by discharging an ink two times at maximum.

To express the four gradations, the drive signals COM-A and COM-B are prepared and each of the drive signals has the former half pattern and the latter half pattern in one period of dot formation in the first embodiment. A configuration where one of the drive signals COM-A and COM-B in the former half and the latter half of one period is selected (or not selected) according to a gradation to be expressed and the signal is supplied to the piezoelectric element 60.

Figure 6:
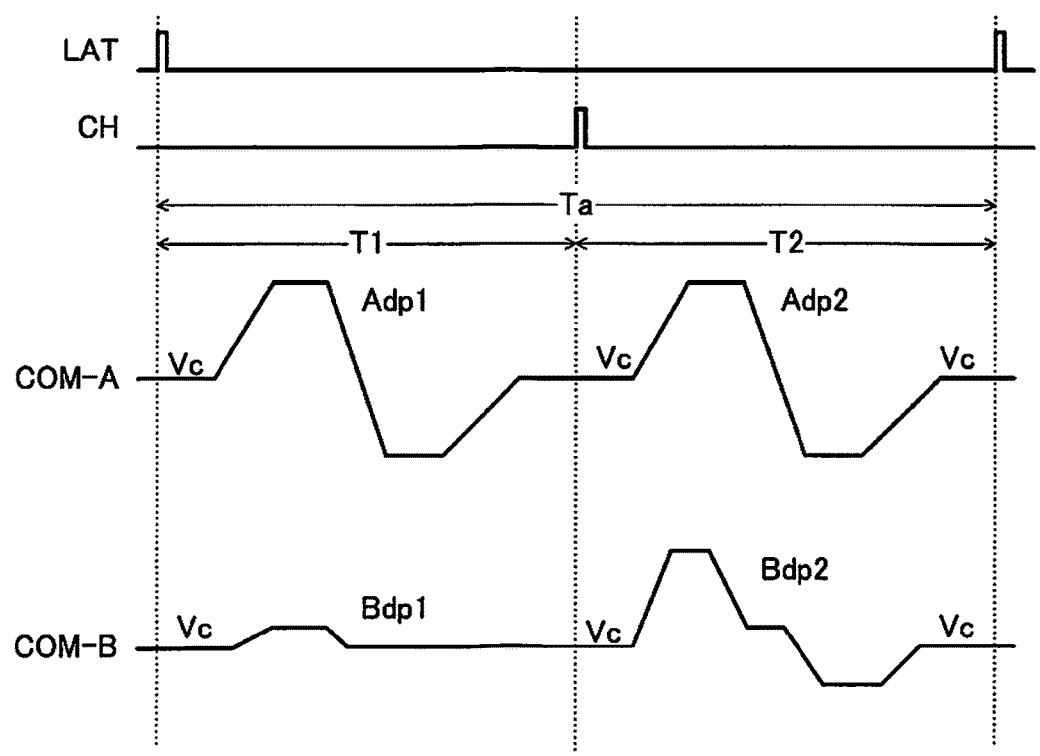
FIG. 6 is a diagram showing waveforms of drive signals.

FIG. 6 is a diagram showing the waveforms of the drive signals COM-A and COM-B. As shown in FIG. 6, the drive signal COM-A has a waveform, in which a trapezoidal waveform Adp1 disposed in a period T1 from the rise of the latch signal LAT to the rise of the change signal CH is followed by a trapezoidal waveform Adp2 disposed in a period T2 from the rise of the change signal CH to the next rise of the latch signal LAT. A period formed of the period T1 and period T2 is set as a period Ta, and a new dot is formed onto the printing medium P for each period Ta.

In the first embodiment, the trapezoidal waveforms Adp1 and Adp2 are waveforms that are almost the same. Each of the trapezoidal waveforms supplied to one end of the piezoelectric element 60 is a waveform, in which a predetermined amount of ink, specifically, a medium amount of ink is discharged from a nozzle 651 corresponding to the piezoelectric element 60.

The drive signal COM-B has a waveform, in which a trapezoidal waveform Bdp1 disposed in the period T1 is followed by a waveform of a trapezoidal waveform Bdp2, which is disposed in the period T2. The trapezoidal waveform Bdp1 is a waveform for slightly vibrating an ink in the vicinity of the opening portion of the nozzle 651 and preventing an increase in the viscosity of the ink. For this reason, even when the trapezoidal waveform Bdp1 is supplied to one end of the piezoelectric element 60, ink droplets are not discharged from the nozzle 651 corresponding to the piezoelectric element 60. The trapezoidal waveform Bdp2 is a waveform that is different from the trapezoidal waveform Adp1 (Adp2). The trapezoidal waveform Bdp2 is a waveform in which a smaller amount of ink than the predetermined amount described above is discharged from the nozzle 651 corresponding to the piezoelectric element 60 when a drive signal having this waveform is supplied to one end of the piezoelectric element 60.

Both of a voltage at a start timing of the trapezoidal waveforms Adp1, Adp2, Bdp1, and Bdp2 and a voltage at an end timing are the same, that is, the voltage Vc. That is, each of the trapezoidal waveforms Adp1, Adp2, Bdp1, and Bdp2 is a waveform that starts with the voltage Vc and ends with the voltage Vc.

Figure 7:
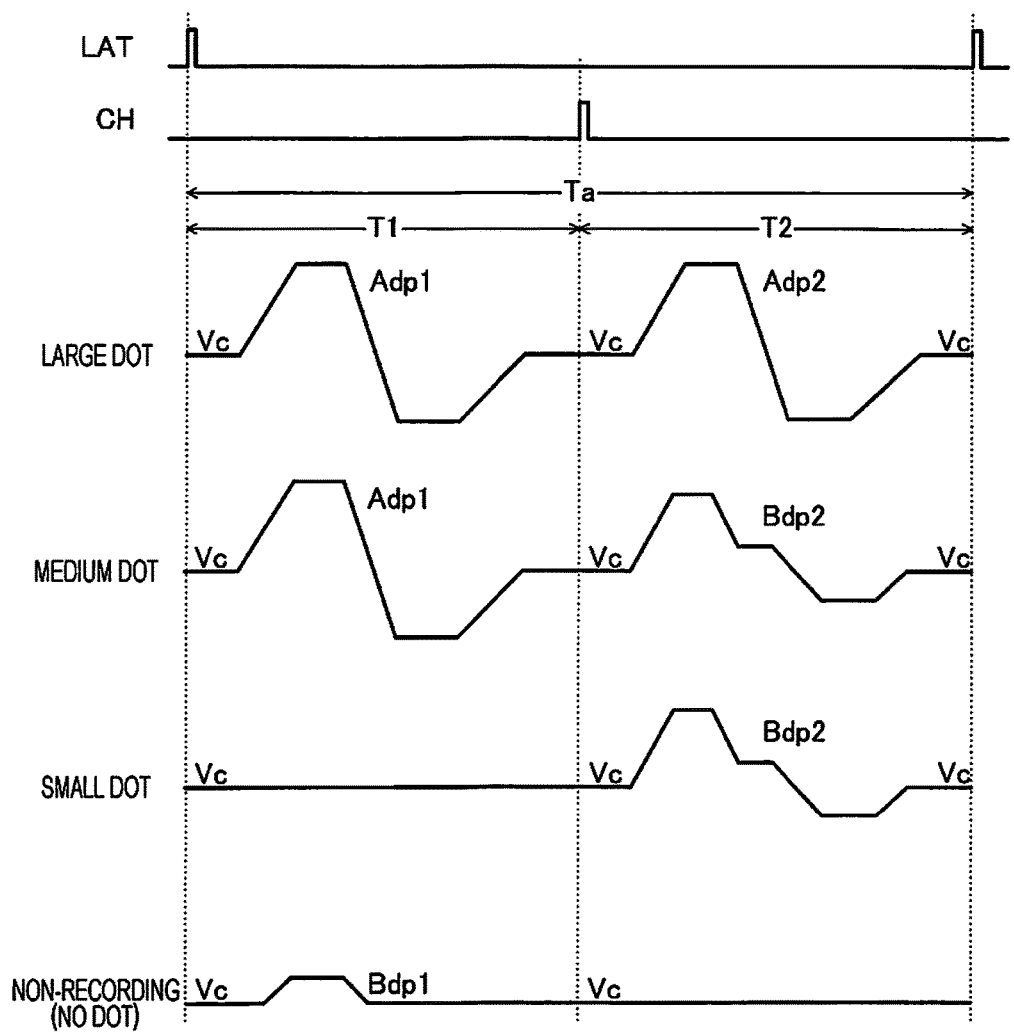
FIG. 7 is a diagram showing the waveforms of the drive signals.

FIG. 7 is a diagram showing a waveform of the drive signal Vout corresponding to each of the "large dot", the "medium dot", the "small dot", and the "non-recording", in the first embodiment.

As shown in FIG. 7, the drive signal Vout corresponding to the "large dot" has a waveform, in which the trapezoidal waveform Adp1 of the drive signal COM-A in the period T1 is followed by the trapezoidal waveform Adp2 of the drive signal COM-A in the period T2. When the drive signal Vout is supplied to one end of the piezoelectric element 60, a medium amount of ink is discharged two times from the nozzle 651 corresponding to the piezoelectric element 60 in the period Ta. For this reason, each ink lands and coalesces to form a large dot on the printing medium P in the period Ta.

The drive signal Vout corresponding to the "medium dot" has a waveform, in which the trapezoidal waveform Adp1 of the drive signal COM-A in the period T1 is followed by the trapezoidal waveform Bdp2 of the drive signal COM-B in the period T2. When the drive signal Vout is supplied to one end of the piezoelectric element 60, a medium amount of ink and a small amount of ink are discharged in total two times from the nozzle 651 corresponding to the piezoelectric element 60 in the period Ta. For this reason, a medium dot is formed on the printing medium P in the period Ta.

The drive signal Vout corresponding to the "small dot" has a waveform, in which the voltage Vc that is a voltage immediately before being held constant due to a capacitive property of the piezoelectric element 60 in the period T1 is followed by the trapezoidal waveform Bdp2 of the drive signal COM-B in the period T2. When the drive signal Vout is supplied to one end of the piezoelectric element 60, a small amount of ink is discharged one time from the nozzle 651 corresponding to the piezoelectric element 60 in the period Ta. For this reason, a small dot is formed on the printing medium P in the period Ta.

The drive signal Vout corresponding to the "non-recording" has a waveform, in which the trapezoidal waveform Bdp1 of the drive signal COM-B in the period T1 is followed by the voltage Vc that is a voltage immediately before being held constant due to a capacitive property of the piezoelectric element 60 in the period T2.

When the drive signal Vout is supplied to one end of the piezoelectric element 60, the nozzle 651 corresponding to the piezoelectric element 60 vibrates slightly in the period T1 and an ink is not discharged in the period Ta. For this reason, an ink does not land and a dot is not formed on the printing medium P.

1.3.3 Electrical Configuration of Drive Circuit

Operation of the drive circuits 50-$a$ and 50-$b$ that generate the drive signals COM-A and COM-B will be described. To describe one drive circuit 50-$a$, out of the two drive circuits, the drive signal COM-A is generated as follows. That is, the drive circuit 50-$a$, firstly, converts the drive data dA supplied from the control signal generating unit 100 to analog, secondly, feeds the output drive signal COM-A back and corrects a deviation of a signal (attenuation signal), which is based on the drive signal COM-A, from a target signal, with a high-frequency component of the drive signal COM-A to generate a modulation signal in accordance with the corrected signal, thirdly, generates an amplified modulation signal by switching a transistor in accordance with the modulation signal, and fourthly, smoothes out (demodulates) the amplified modulation signal with a low pass filter to output the smoothed out signal as the drive signal COM-A.

The other drive circuit 50-$b$ has the same configuration, and is different only in terms of the fact that the drive signal COM-B is output from the drive data dB. In the following FIG. 8, the drive circuits 50-$a$ and 50-$b$ will be described as the drive circuit 50 without differentiating between the two drive circuits.

Drive data to be input and a drive signal to be output are expressed with dA (dB) and COM-A (COM-B), respectively. In the case of the drive circuit 50-$a$, it is expressed that the drive data dA is input and the drive signal COM-A is output. In the case of the drive circuit 50-$b$, it is expressed that the drive data dB is input and the drive signal COM-B is output.

Figure 8:
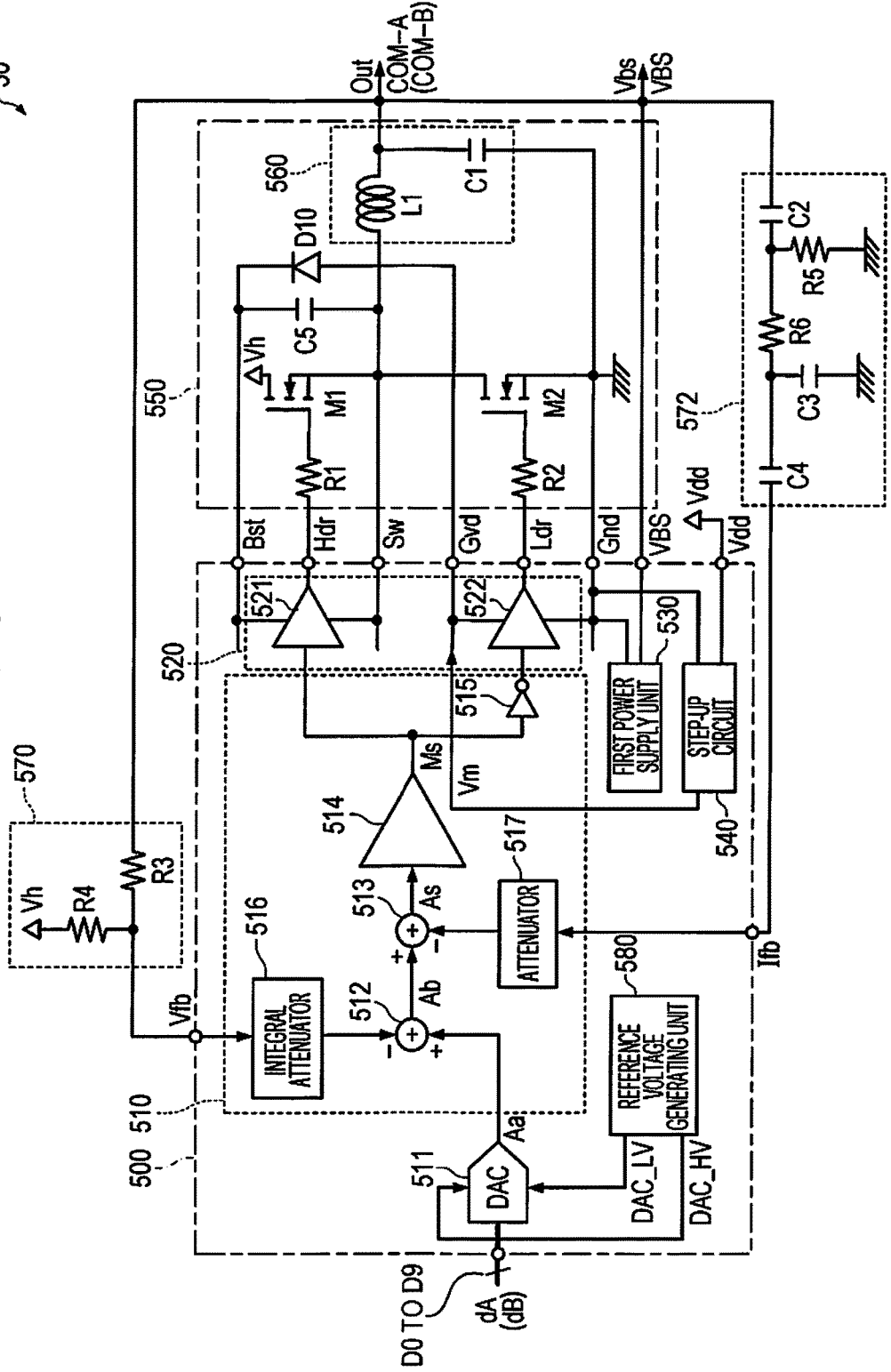
FIG. 8 is a diagram showing a circuit configuration of a drive circuit.

FIG. 8 is a diagram showing a circuit configuration of the drive circuit 50.

Although a configuration for outputting the drive signal COM-A is shown in FIG. 8, an integrated circuit device 500 is, in fact, a circuit in which circuits for generating both of the two drive signals COM-A and COM-B are packaged into one circuit.

As shown in FIG. 8, the drive circuit 50 includes the integrated circuit device 500, an output circuit 550, and various types of elements such as a plurality of resistances and capacitors.

The drive circuit 50 in the first embodiment includes a modulating unit 510 that generates a modulation signal obtained by pulse-modulating an original signal, a gate driver 520 that generates an amplified control signal based on the modulation signal, a transistor (a first transistor M1 and a second transistor M2) that generates an amplified modulation signal obtained by amplifying the modulation signal based on the amplified control signal, a low pass filter 560 that demodulates the amplified modulation signal to generate a drive signal, a feedback circuit (a first feedback circuit 570 and a second feedback circuit 572) that feeds the drive signal back to the modulating unit 510, and a step-up circuit 540. In addition, the drive circuit 50 may include a first power supply unit 530 that applies a signal to a terminal, which is different from a terminal to which a drive signal of the piezoelectric element 60 is applied.

The integrated circuit device 500 in the first embodiment includes the modulating unit 510 and the gate driver 520.

The integrated circuit device 500 outputs a gate signal (amplified control signal) to each of the first transistor M1 and the second transistor M2 based on the 10-bit drive data dA (original signal) input from the drive data receiving unit 330 via terminals D0 to D9. For this reason, the integrated circuit device 500 includes a digital to analog converter (DAC) 511, an adder 512, an adder 513, a comparator 514, an integral attenuator 516, an attenuator 517, an inverter 515, a first gate driver 521, a second gate driver 522, the first power supply unit 530, the step-up circuit 540, and a reference voltage generating unit 580.

The reference voltage generating unit 580 generates a first reference voltage DAC_HV (reference voltage on a high-voltage side) and a second reference voltage DAC_LV (reference voltage on a low-voltage side), which are regulated by a regulating signal, and supplies the voltages to the DAC 511.

The DAC 511 converts the drive data dA, in which the waveform of the drive signal COM-A is defined, to an underlying drive signal Aa, which is a voltage between the first reference voltage DAC_HV and the second reference voltage DAC_LV, and supplies the signal to an input end (+) of the adder 512. The maximum value and the minimum value of the voltage amplitude of the underlying drive signal Aa are determined by the first reference voltage DAC_HV and the second reference voltage DAC_LV (for example, approximately 1 to 2 V) respectively. When the voltage is amplified, the drive signal COM-A is obtained. That is, the underlying drive signal Aa is a target signal before the amplification of the drive signal COM-A.

The integral attenuator 516 attenuates and integrates a voltage from a terminal Out, which is input via a terminal Vfb, that is, the drive signal COM-A to supply to an input end (−) of the adder 512.

The adder 512 supplies a signal Ab, which is an integrated voltage obtained by deducting a voltage from the input end (−) from a voltage from the input end (+), to an input end (+) of the adder 513.

A power supply voltage of a circuit ranging from the DAC 511 to the inverter 515 is 3.3 V (a voltage VDD supplied from a power supply terminal Vdd) with a low amplitude. For this reason, since there is a case where the voltage of the drive signal COM-A exceeds 40 V at maximum while the voltage of the underlying drive signal Aa is only approximately 2 V at maximum, the voltage of the drive signal COM-A is attenuated by the integral attenuator 516 in order to match amplitude ranges of both voltages when acquiring a deviation.

The attenuator 517 attenuates a high-frequency component of the drive signal COM-A input via a terminal Ifb to supply to an input end (−) of the adder 513. The adder 513 supplies a signal As, which is a voltage obtained by subtracting a voltage from the input end (−) from a voltage from the input end (+), to the comparator 514. As in the integral attenuator 516, attenuation by the attenuator 517 is for matching the amplitudes in feeding back the drive signal COM-A.

The voltage of the signal As output from the adder 513 is a voltage obtained by deducting the attenuation voltage of a signal supplied to the terminal Vfb from the voltage of the underlying drive signal Aa and subtracting the attenuation voltage of a signal supplied to the terminal Ifb. For this reason, the voltage of the signal As output from the adder 513 can be referred to as a signal obtained by correcting a deviation of the attenuation voltage of the drive signal COM-A, which is output from the terminal Out, from the voltage of the underlying drive signal Aa, which is a target, with the high-frequency component of the drive signal COM-A.

Based on a subtraction voltage from the adder 513, the comparator 514 outputs a modulation signal Ms obtained by pulse-modulation as follows. Specifically, the comparator 514 outputs the modulation signal Ms, which is at a level H when the signal As output from the adder 513 is equal to or larger than a voltage threshold Vth1, in the case of a voltage rise, and outputs the modulation signal Ms, which is at a level L when the signal As falls short of a voltage threshold Vth2, in the case of a voltage drop. As will be described later, a voltage threshold is set so as to satisfy a relationship of Vth1>Vth2.

The modulation signal Ms from the comparator 514 is supplied to the second gate driver 522 through logic inversion by the inverter 515. The modulation signal Ms is supplied to the first gate driver 521 without going through logic inversion. For this reason, logic levels supplied to the first gate driver 521 and the second gate driver 522 are in a relationship exclusive to each other.

The logic levels supplied to the first gate driver 521 and the second gate driver 522 may be controlled in terms of timing such that, in reality, the logic levels do not come at a level H simultaneously (such that the first transistor M1 and the second transistor M2 are not turned on simultaneously). For this reason, in the strict sense, the term "exclusive" means that the logic levels do not simultaneously come at a level H (the first transistor M1 and the second transistor M2 are not turned on simultaneously).

Although the term "modulation signal" means the modulation signal Ms in the narrow sense, the negative signal of the modulation signal Ms is also included in the modulation signal, considering that pulse-modulation is performed according to the underlying drive signal Aa. That is, a modulation signal obtained by pulse-modulation according to the underlying drive signal Aa includes not only the modulation signal Ms but also a signal obtained by inverting the logic level of the modulation signal Ms and a signal controlled in terms of timing.

Since the comparator 514 outputs the modulation signal Ms, a circuit ranging over to the comparator 514 or the inverter 515, that is, including the adder 512, the adder 513, the comparator 514, the inverter 515, the integral attenuator 516, and the attenuator 517, corresponds to the modulating unit 510 that generates a modulation signal.

The first gate driver 521 level-shifts a low logic amplitude, which is an output signal of the comparator 514, so as to be a high logic amplitude to output from a terminal Hdr. Out of power supply voltages of the first gate driver 521, a higher voltage is a voltage applied via a terminal Bst, and a lower voltage is a voltage applied via a terminal Sw. The terminal Bst is connected to one end of a capacitor C5 and a cathode electrode of a diode D10 for backflow prevention. The terminal Sw is connected to a source electrode of the first transistor M1, a drain electrode of the second transistor M2, the other end of the capacitor C5, and one end of an inductor L1. An anode electrode of the diode D10 is connected to a terminal Gvd, and a voltage Vm (for example, 7.5 V) output by the step-up circuit 540 is applied thereto. Therefore, a potential difference between the terminal Bst and the terminal Sw is substantially equal to a potential difference between both ends of the capacitor C5, that is, the voltage Vm (for example, 7.5 V).

The second gate driver 522 operates on a low electric potential side of the first gate driver 521. The second gate driver 522 level-shifts a low logic amplitude (level L: 0 V and level H: 3.3 V), which is an output signal of the inverter 515, to a high logic amplitude (for example, level L: 0 V and level H: 7.5 V) to output from a terminal Ldr. Out of power supply voltages of the second gate driver 522, the voltage Vm (for example, 7.5 V) is applied as a higher voltage, and a zero voltage is applied via a ground terminal Gnd as a lower voltage. That is, the ground terminal Gnd is earthed to the ground. In addition, the terminal Gvd is connected to the anode electrode of the diode D10.

The first transistor M1 and the second transistor M2 are, for example, N-channel field effect transistors (FET). In the first transistor M1 on a high side, out of the two transistors, a voltage Vh (for example, 42 V) is applied to a drain electrode and a gate electrode is connected to the terminal Hdr via a resistance R1. In the second transistor M2 on a low side, a gate electrode is connected to the terminal Ldr via a resistance R2 and a source electrode is earthed to the ground.

Therefore, when the first transistor M1 is turned off and the second transistor M2 is turned on, the voltage of the terminal Sw is 0 V and the voltage Vm (for example, 7.5 V) is applied to the terminal Bst. On the other hand, when the first transistor M1 is turned on and the second transistor M2 is turned off, Vh (for example, 42 V) is applied to the terminal Sw and Vh+Vm (for example, 49.5 V) is applied to the terminal Bst.

That is, with the capacitor C5 being as a floating power supply, the first gate driver 521 outputs an amplified control signal, of which level L is 0 V and level H is Vm (for example, 7.5 V), or of which level L is approximately Vh (for example, 42 V) and level H is approximately Vh+Vm (for example, 49.5 V), since a reference electric potential (the electric potential of the terminal Sw) changes to 0 V or Vh (for example, 42 V) according to operation of the first transistor M1 and the second transistor M2. The second gate driver 522 outputs an amplified control signal, of which level L is 0 V and level H is Vm (for example, 7.5 V), since a reference electric potential (the electric potential of the terminal Gnd) is fixed at 0 V regardless of operation of the first transistor M1 and the second transistor M2.

The other end of the inductor L1 is the terminal Out, which is an output of the drive circuit 50, and the drive signal COM-A from the terminal Out is supplied to the head unit 20 via the cable 19 (refer to FIG. 2).

The terminal Out is connected to each of one end of a capacitor C1, one end of a capacitor C2, and one end of a resistance R3. Out of the above elements, the other end of the capacitor C1 is earthed to the ground. For this reason, the inductor L1 and the capacitor C1 function as the low pass filter 560 that smoothes out an amplified modulation signal, which appears at a connection point between the first transistor M1 and the second transistor M2.

The other end of the resistance R3 is connected to the terminal Vfb and one end of a resistance R4, and the voltage Vh is applied to the other end of the resistance R4. Accordingly, the drive signal COM-A, which has passed through the first feedback circuit 570 (circuit configured of the resistance R3 and the resistance R4) from the terminal Out, is pulled up to be fed back to the terminal Vfb.

The other end of the capacitor C2 is connected to one end of a resistance R5 and one end of a resistance R6. Out of the above elements, the other end of the resistance R5 is earthed to the ground. For this reason, the capacitor C2 and the resistance R5 function as a high pass filter that allows a high-frequency component of the drive signal COM-A from the terminal Out having a frequency that is equal to or higher than a cut-off frequency to pass therethrough. The cut-off frequency of the high pass filter is set to, for example, approximately 9 MHz.

The other end of the resistance R6 is connected to one end of a capacitor C4 and one end of a capacitor C3. Out of the above elements, the other end of the capacitor C3 is earthed to the ground. For this reason, the resistance R6 and the capacitor C3 function as a low pass filter that allows a low-frequency component having a frequency that is equal to or lower than a cut-off frequency to pass therethrough, out of signal components which have passed through the high pass filter. The cut-off frequency of the low pass filter is set to, for example, approximately 160 MHz.

Since the cut-off frequency of the high pass filter is set so as to be lower than the cut-off frequency of the low pass filter, the high pass filter and the low pass filter function as a band pass filter that allows a high-frequency component of the drive signal COM-A in a predetermined frequency range to pass therethrough.

The other end of the capacitor C4 is connected to the terminal Ifb of the integrated circuit device 500. Accordingly, out of high-frequency components of the drive signal COM-A, which has passed through the second feedback circuit 572 (circuit configured of the capacitor C2, the resistance R5, the resistance R6, the capacitor C3, and the capacitor C4) functioning as the band pass filter, a direct current component is cut and fed back to the terminal Ifb.

The drive signal COM-A output from the terminal Out is a signal obtained by smoothing out an amplified modulation signal at the connection point (terminal Sw) between the first transistor M1 and the second transistor M2 with the low pass filter 560 configured of the inductor L1 and the capacitor C1. Since the drive signal COM-A is fed back to the adder 512 via the terminal Vfb after being integrated and subtracted, self-oscillation occurs at a frequency determined by a delay of feedback (a sum of a delay caused by smoothing-out of the inductor L1 and the capacitor C1 and a delay caused by the integral attenuator 516) and a transfer function of the feedback.

However, since the amount of a delay through a feedback path via the terminal Vfb is large, there is a case where the feedback via the terminal Vfb only is not enough to make the frequency of self-oscillation higher to an extent that the accuracy of the drive signal COM-A can be sufficiently ensured.

Thus, by providing a path through which a high-frequency component of the drive signal COM-A is fed back via the terminal Ifb in addition to the path via the terminal Vfb, a delay can be made shorter from a perspective of the entire circuit in the first embodiment. For this reason, the frequency of the signal As, which is obtained by adding a high-frequency component of the drive signal COM-A to the signal Ab, becomes higher to an extent that the accuracy of the drive signal COM-A can be sufficiently ensured, compared to a case where there is no path via the terminal Ifb.

Figure 9:
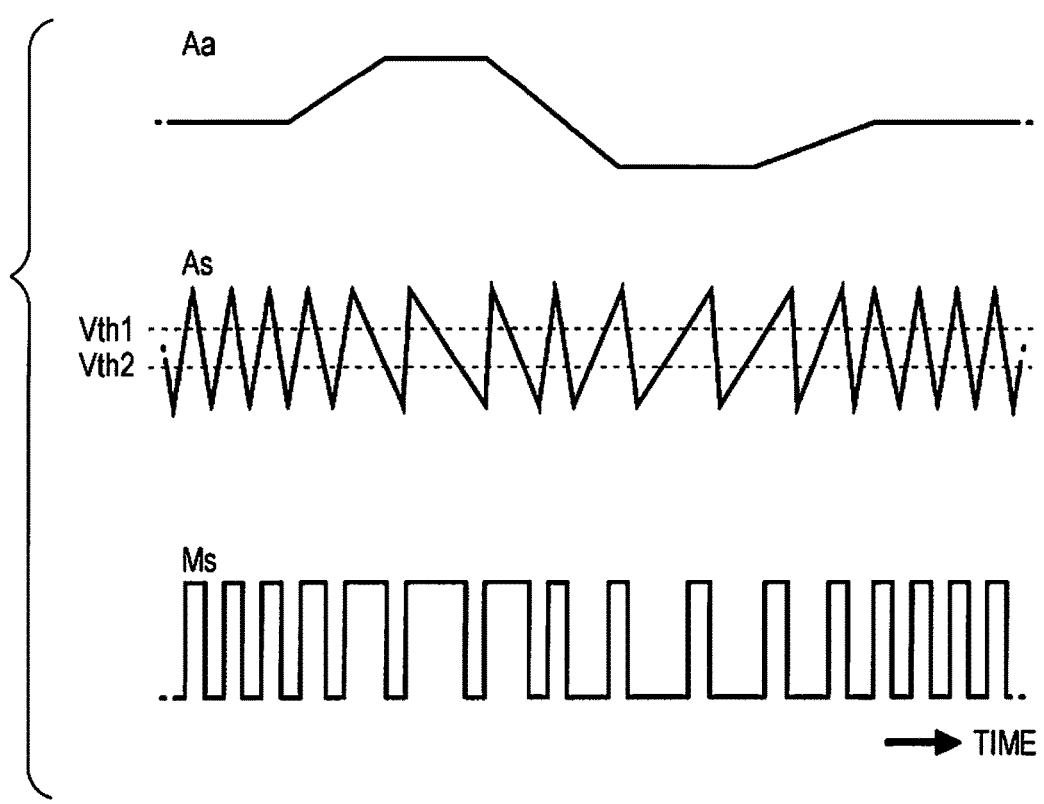
FIG. 9 is a diagram for illustrating operation of the drive circuit.

FIG. 9 is a diagram showing the waveform of the underlying drive signal Aa in association with the waveforms of the signal As and the modulation signal Ms.

As shown in FIG. 9, the signal As has a triangular wave, and the oscillation frequency thereof fluctuates according to the voltage (input voltage) of the underlying drive signal Aa. Specifically, the oscillation frequency becomes the highest in a case where an input voltage is an intermediate value. The oscillation frequency becomes lower as an input voltage becomes higher than the intermediate value or as an input voltage becomes lower than the intermediate value.

In addition, the upward inclination (rise of the voltage) and the downward inclination (drop of the voltage) of the triangular wave of the signal As are almost the same when an input voltage is close to an intermediate value. For this reason, the duty ratio of the modulation signal Ms, which is a result obtained by the comparator 514 comparing the signal As to the voltage thresholds Vth1 and Vth2, is almost 50%. When an input voltage becomes higher than the intermediate value, the downward inclination of the signal As becomes moderate. For this reason, a period for which the modulation signal Ms is at a level H becomes relatively longer and a duty ratio becomes higher. As an input voltage becomes lower than the intermediate value, the upward inclination of the signal As becomes moderate. For this reason, a period for which the modulation signal Ms is at a level H becomes relatively shorter and a duty ratio becomes lower.

For this reason, the modulation signal Ms becomes a pulse density modulation signal as follows. That is, the duty ratio of the modulation signal Ms is almost 50% when the input voltage has the intermediate value. As the input voltage becomes higher than the intermediate value, the duty ratio becomes higher. As the input voltage becomes lower than the intermediate value, the duty ratio becomes lower.

The first gate driver 521 turns the first transistor M1 on/off based on the modulation signal Ms. That is, the first gate driver 521 turns the first transistor M1 on when the modulation signal Ms is at a level H, and turns the first transistor off when the modulation signal Ms is at a level L. The second gate driver 522 turns the second transistor M2 on/off based on a logic inversion signal of the modulation signal Ms. That is, the second gate driver 522 turns the second transistor M2 off when the modulation signal Ms is at a level H, and turns the second transistor on when the modulation signal Ms is at a level L.

Therefore, the voltage of the drive signal COM-A, which is obtained by smoothing out the amplified modulation signal at the connection point between the first transistor M1 and the second transistor M2 with the inductor L1 and the capacitor C1, becomes higher as the duty ratio of the modulation signal Ms becomes higher, and becomes lower as the duty ratio becomes lower. Consequently, the drive signal COM-A is controlled so as to be a signal obtained by increasing and power-amplifying the voltage of the underlying drive signal Aa and is output.

Since pulse density modulation is used, the drive circuit 50 is advantageous in that the width of change in the duty ratio can be made larger compared to pulse width modulation in which a modulation frequency is fixed.

That is, since a minimum positive pulse width and a minimum negative pulse width, which can be dealt by the entire circuit, are restricted by properties of the circuit, only a predetermined range (for example, a range of 10% to 90%) can be ensured as the width of change in the duty ratio in pulse width modulation when a frequency is fixed. On the other hand, since the oscillation frequency becomes lower as an input voltage moves away from the intermediate value in pulse density modulation, the duty ratio can be made higher in a region with a high input voltage and the duty ratio can be made lower in a region with a low input voltage. For this reason, in self-oscillation pulse density modulation, a wider range (for example, a range of 5% to 95%) can be ensured as the width of change in the duty ratio.

The drive circuit 50 self-oscillates and a circuit that generates carrier waves having a high frequency, such as forced-oscillation, is not necessary. For this reason, the drive circuit is advantageous in that it is easy to integrate circuits other than a circuit dealing with a high voltage, that is, a portion of the integrated circuit device 500.

Since there is not only the path via the terminal Vfb but also the path through which a high-frequency component is fed back via the terminal Ifb as a feedback path of the drive signal COM-A in the drive circuit 50, a delay from a perspective of the entire circuit becomes shorter. For this reason, since the frequency of self-oscillation becomes higher, the drive circuit 50 can accurately generate the drive signal COM-A.

Referring back to FIG. 8, in an example shown in FIG. 8, the resistance R1, the resistance R2, the first transistor M1, the second transistor M2, the capacitor C5, the diode D10, and the low pass filter 560 configure the output circuit 550 that generates an amplified control signal based on a modulation signal and generates a drive signal based on the amplified control signal to output to a capacitive load (piezoelectric element 60).

The first power supply unit 530 applies a signal to a terminal that is different from a terminal to which a drive signal for the piezoelectric element 60 is applied. The first power supply unit 530 is configured of, for example, a constant voltage circuit such as a bandgap reference circuit. The first power supply unit 530 outputs the voltage VBS from a terminal Vbs. In the example shown in FIG. 8, the first power supply unit 530 generates the voltage VBS with a ground electric potential of the ground terminal Gnd being as reference.

The step-up circuit 540 supplies power to the gate driver 520. In the example shown in FIG. 8, the step-up circuit 540 steps up the voltage VDD supplied from the power supply terminal Vdd with the ground electric potential of the ground terminal Gnd being as reference and generates the voltage Vm, which is a power supply voltage on a high electric potential side of the second gate driver 522. Although the step-up circuit 540 can be configured of a charge pump circuit and a switching regulator, a case where the step-up circuit is configured of a charge pump circuit can better suppress the generation of a noise compared to a case where the step-up circuit is configured of a switching regulator. For this reason, since the drive circuit 50 can more accurately generate the drive signal COM-A and can control a voltage applied to the piezoelectric element 60 with high accuracy, the accuracy of discharging a liquid can be improved. Since a power generating unit of the gate driver 520 is miniaturized by configuring the step-up circuit of the charge pump circuit, it is possible to mount the gate driver on the integrated circuit device 500, and the entire area of the drive circuit 50 can be significantly reduced compared to a case where the power generating unit of the gate driver 520 is configured outside the integrated circuit device 500.

1.3.4 Configuration of Selection Control Unit and Selecting Unit

Figure 10:
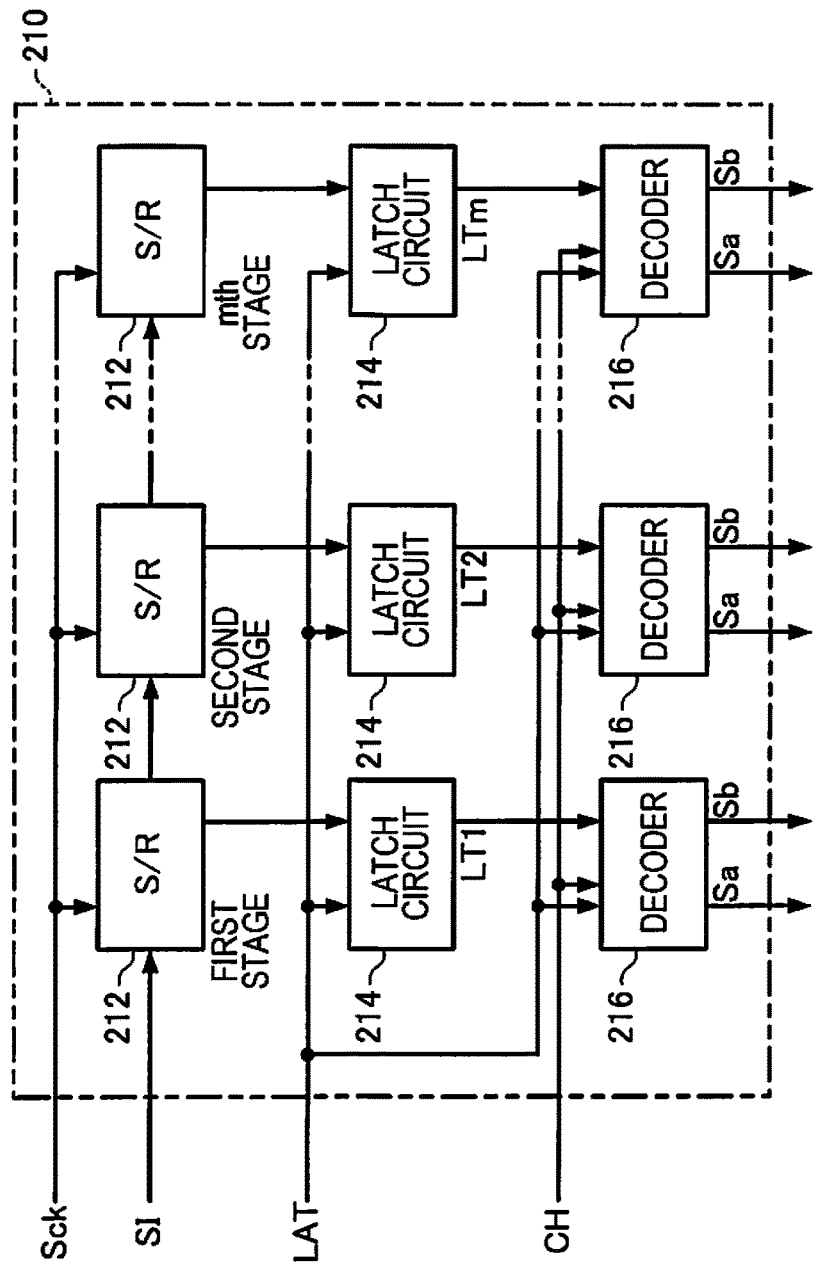
FIG. 10 is a diagram showing a configuration of a selection control unit.

FIG. 10 is a diagram showing a configuration of the selection control unit 210. As shown in FIG. 10, the clock signal Sck, the print data signal SI, the latch signal LAT, and the change signal CH are supplied to the selection control unit 210. A set of a shift register (S/R) 212, a latch circuit 214, and a decoder 216 is provided in the selection control unit 210 so as to correspond to the each of the piezoelectric elements 60 (nozzles 651).

The print data signal SI is in total 2 m bit signals including 2-bit print data (SIH, SIL) for selecting any one of the "large dot", the "medium dot", the "small dot", and the "non-recording" with respect to each of the m discharging units 600.

The print data signal SI is serially supplied from the control signal restoring unit 320 in synchronization with the clock signal Sck. The shift register 212 has a configuration of temporarily holding the serially supplied print data signal SI for each of two bits of print data (SIH, SIL) corresponding to each of the nozzles 651.

Specifically, a configuration, in which the same number of the shift registers 212 as the number of stages that correspond to the piezoelectric elements 60 (nozzles) are cascade-connected to each other and the serially supplied print data signal SI is subsequently transmitted to the next stage in accordance with the clock signal Sck, is adopted.

When the number of the piezoelectric elements 60 is m (m is a plural number), stages are expressed as a first stage, a second stage, . . . , and a mth stage in order of being on an upstream side where the print data signal SI is supplied in order to differentiate between the shift registers 212.

Each of the m latch circuits 214 latches 2-bit print data (SIH, SIL) held by each of the m shift registers 212 upon the rise of the latch signal LAT.

Each of the m decoders 216 decodes the 2-bit print data (SIH, SIL) latched by each of the m latch circuits 214, outputs selection signals Sa and Sb for each of the periods T1 and T2 defined by the latch signal LAT and the change signal CH, and defines the selection by the selecting unit 230.

Figures 11, 12:
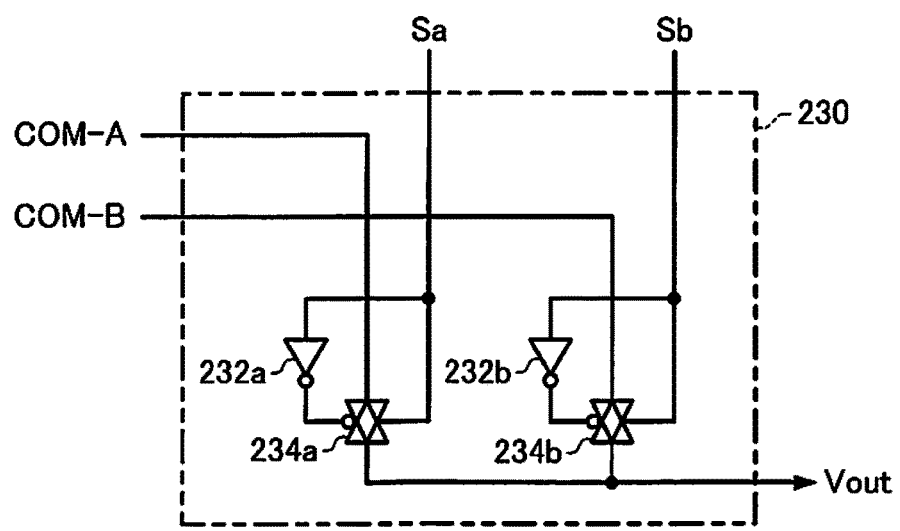
FIG. 11 is a diagram showing contents of decoding by a decoder.
FIG. 12 is a diagram showing a configuration of a selecting unit corresponding to one piezoelectric element (nozzle).

FIG. 11 is a diagram showing the contents of decoding by the decoder 216. For example, when the latched 2-bit print data (SIH, SIL) is (1, 0), the decoder 216 sets the logic levels of the selection signals Sa and Sb to levels H and L respectively in the period T1, and to levels L and H respectively in the period T2 and outputs the signals.

The logic levels of the selection signals Sa and Sb are shifted by a level shifter (not illustrated) to higher amplitude logic than the logic levels of the clock signal Sck, the print data signal SI, the latch signal LAT, and the change signal CH.

FIG. 12 is a diagram showing a configuration of the selecting unit 230 corresponding to one piezoelectric element 60 (nozzle 651).

As shown in FIG. 12, the selecting unit 230 has inverters (NOT gate) 232a and 232b and transfer gates 234a and 234b.

The selection signal Sa from the decoder 216 is supplied to a positive control end of the transfer gate 234a, to which a circle is not attached, while being logically inverted by the inverter 232a and being supplied to a negative control end of the transfer gate 234a, to which a circle is attached. Similarly, the selection signal Sb is supplied to a positive control end of the transfer gate 234b while being logically inverted by the inverter 232b and being supplied to a negative control end of the transfer gate 234b.

The drive signal COM-A is supplied to an input end of the transfer gate 234a and the drive signal COM-B is supplied to an input end of the transfer gate 234b. Output ends of the transfer gates 234a and 234b are commonly connected to each other, and the drive signal Vout is output to the head 21 via a common connection terminal.

When the selection signal Sa is at a level H, the transfer gate 234a electrically connects between the input end and the output end (switching on). When the selection signal Sa is at a level L, the transfer gate electrically disconnects between the input end and the output end (switching off). Similarly, the transfer gate 234b also switches on/off between the input end and the output end according to the selection signal Sb.

Figure 13:
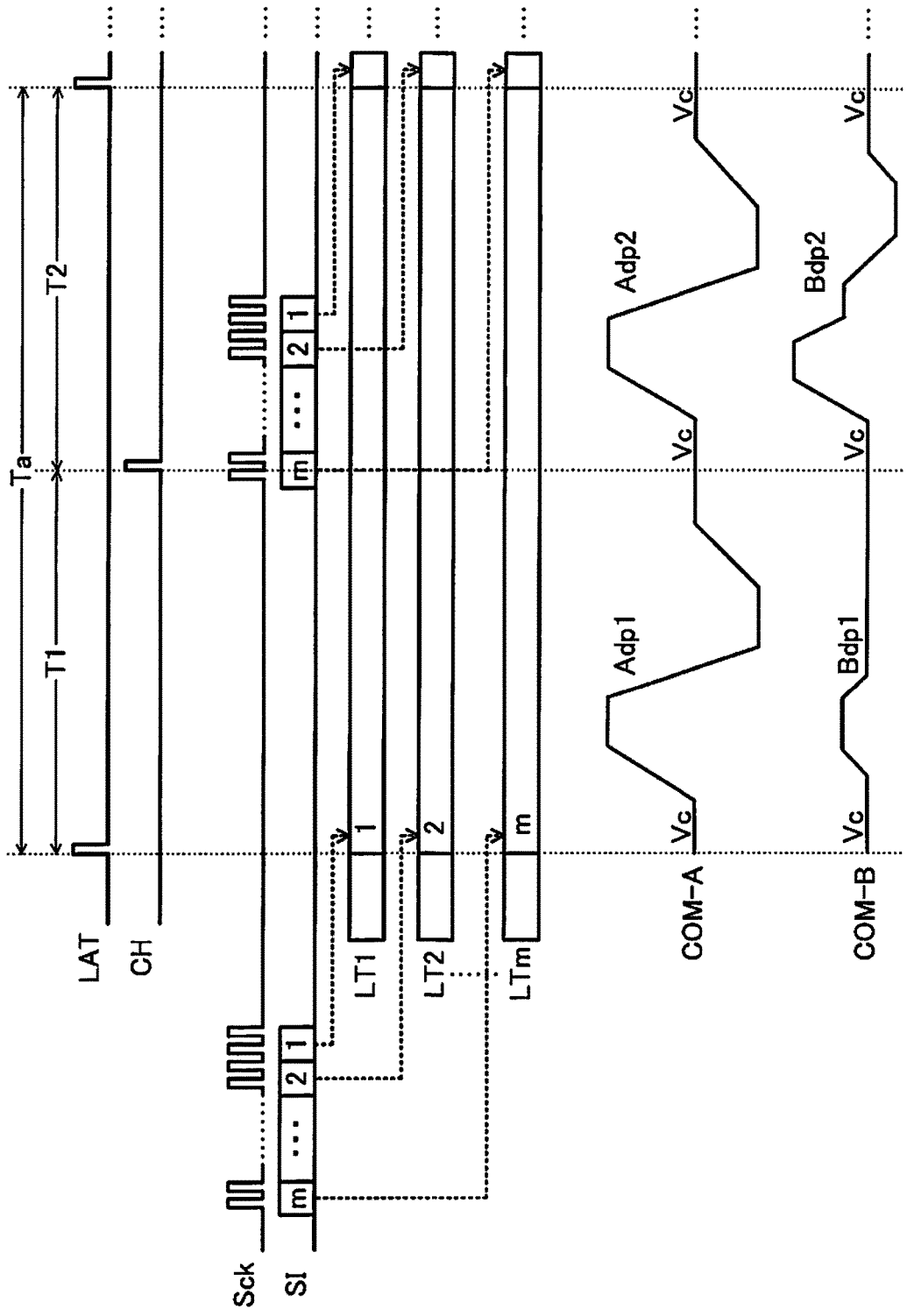
FIG. 13 is a diagram for illustrating operation of the selection control unit and operation of the selecting unit.

Next, operation of the selection control unit 210 and operation of the selecting unit 230 will be described with reference to FIG. 13.

The print data signal SI is serially supplied in synchronization with the clock signal Sck from the control signal restoring unit 320 and is subsequently transmitted to the shift register 212 corresponding to each nozzle. When the control signal restoring unit 320 stops supplying the clock signal Sck, the 2-bit print data (SIH, SIL) corresponding to each of the nozzles comes to a state of being held in each of the shift registers 212. The print data signal SI is supplied to the shift registers 212 corresponding to the nozzles at the last mth stage, . . . , the second stage, and the first stage in this order.

When the latch signal LAT rises, each of the latch circuits 214 simultaneously latches the 2-bit print data (SIH, SIL) held by each of the shift registers 212. In FIG. 13, LT1, LT2, . . . , and LTm indicate 2-bit print data (SIH, SIL) latched by the latch circuits 214 corresponding to the shift registers 212 at the first stage, the second stage, . . . , and the mth stage.

The decoder 216 outputs contents as shown in FIG. 11 such as the logic levels of the selection signals Sa and Sb in each of the periods T1 and T2 according to the size of a dot defined by the latched 2-bit print data (SIH, SIL).

That is, the decoder 216 sets the selection signals Sa and Sb to levels H and L in the period T1 and also to levels H and L in the period T2 in a case where the print data (SIH, SIL) is (1, 1) and the size of a dot is defined as a large dot. The decoder 216 sets the selection signals Sa and Sb to levels H and L in the period T1 and to levels L and H in the period T2 in a case where the print data (SIH, SIL) is (1, 0) and the size of a dot is defined as a medium dot. The decoder 216 sets the selection signals Sa and Sb to levels L and L in the period T1 and to levels L and H in the period T2 in a case where the print data (SIH, SIL) is (0, 1) and the size of a dot is defined as a small dot. The decoder 216 sets the selection signals Sa and Sb to levels L and H in the period T1 and to levels L and L in the period T2 in a case where the print data (SIH, SIL) is (0, 0) and non-recording is defined.

When the print data (SIH, SIL) is (1, 1), the selecting unit 230 selects the drive signal COM-A (trapezoidal waveform Adp1) since the selection signals Sa and Sb are at levels H and L in the period T1 and selects the drive signal COM-A (trapezoidal waveform Adp2) since the selection signals Sa and Sb are at levels H and L also in the period T2. As a result, the drive signal Vout corresponding to the "large dot" shown in FIG. 7 is generated.

When the print data (SIH, SIL) is (1, 0), the selecting unit 230 selects the drive signal COM-A (trapezoidal waveform Adp1) since the selection signals Sa and Sb are at levels H and L in the period T1 and selects the drive signal COM-B (trapezoidal waveform Bdp2) since the selection signals Sa and Sb are at levels L and H in the period T2. As a result, the drive signal Vout corresponding to the "medium dot" shown in FIG. 7 is generated.

When the print data (SIH, SIL) is (0, 1), the selecting unit 230 does not select either of the drive signals COM-A and COM-B since the selection signals Sa and Sb are at levels L and L in the period T1 and selects the drive signal COM-B (trapezoidal waveform Bdp2) since the selection signals Sa and Sb are at levels L and H in the period T2. As a result, the drive signal Vout corresponding to the "small dot" shown in FIG. 7 is generated.

When the print data (SIH, SIL) is (0, 0), the selecting unit 230 selects the drive signal COM-B (trapezoidal waveform Bdp1) since the selection signals Sa and Sb are at levels L and H in the period T1 and does not select either of the drive signals COM-A and COM-B since the selection signals Sa and Sb are at levels L and L also in the period T2. As a result, the drive signal Vout corresponding to the "non-recording" shown in FIG. 7 is generated.

Since either of the drive signals COM-A and COM-B are not selected in a period when the selection signals Sa and Sb are at levels L and L, one end of the piezoelectric element 60 is opened. However, the drive signal Vout is held at the immediately before voltage Vc due to a capacitive property of the piezoelectric element 60.

The drive signals COM-A and COM-B in the first embodiment are merely examples. In fact, various combinations of waveforms prepared in advance according to a speed at which the head unit 20 moves and the characteristics of a printing medium are used.

Although an example in which the piezoelectric elements 60 bend upwards with a rise in the voltage has been described herein, the piezoelectric elements 60 bend downwards with a rise in the voltage when a voltage supplied to the electrodes 611 and 612 is reversed. For this reason, in a configuration where the piezoelectric elements 60 bend downwards with a rise in the voltage, the drive signals COM-A and COM-B given as examples in the first embodiment have waveforms which are inverted with the voltage Vc being as reference.

1.4 Configuration of Printing Unit

Figure 14:
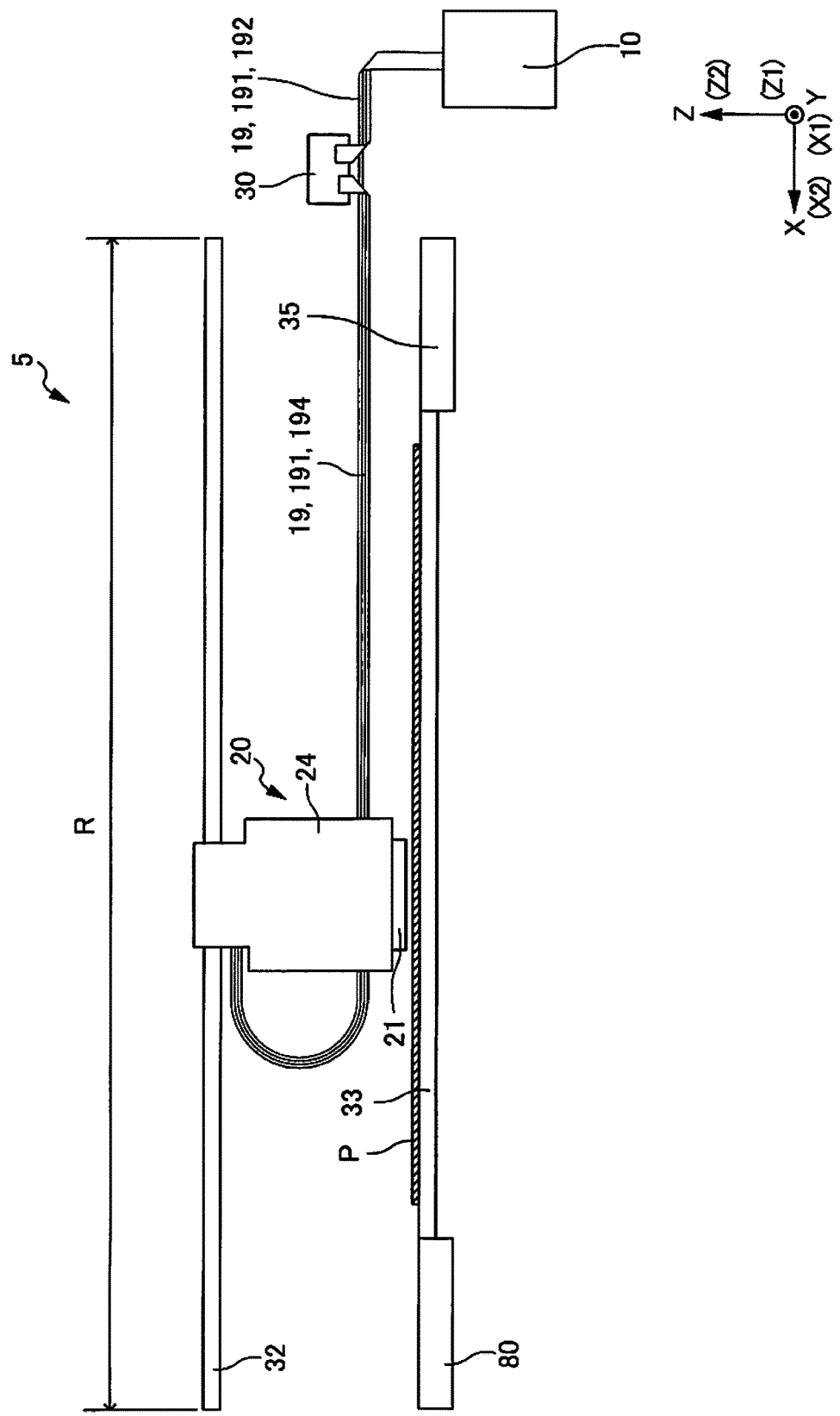
FIG. 14 is a diagram showing an internal configuration of a head unit when seen in a main scanning direction in a first embodiment.
Figure 15:
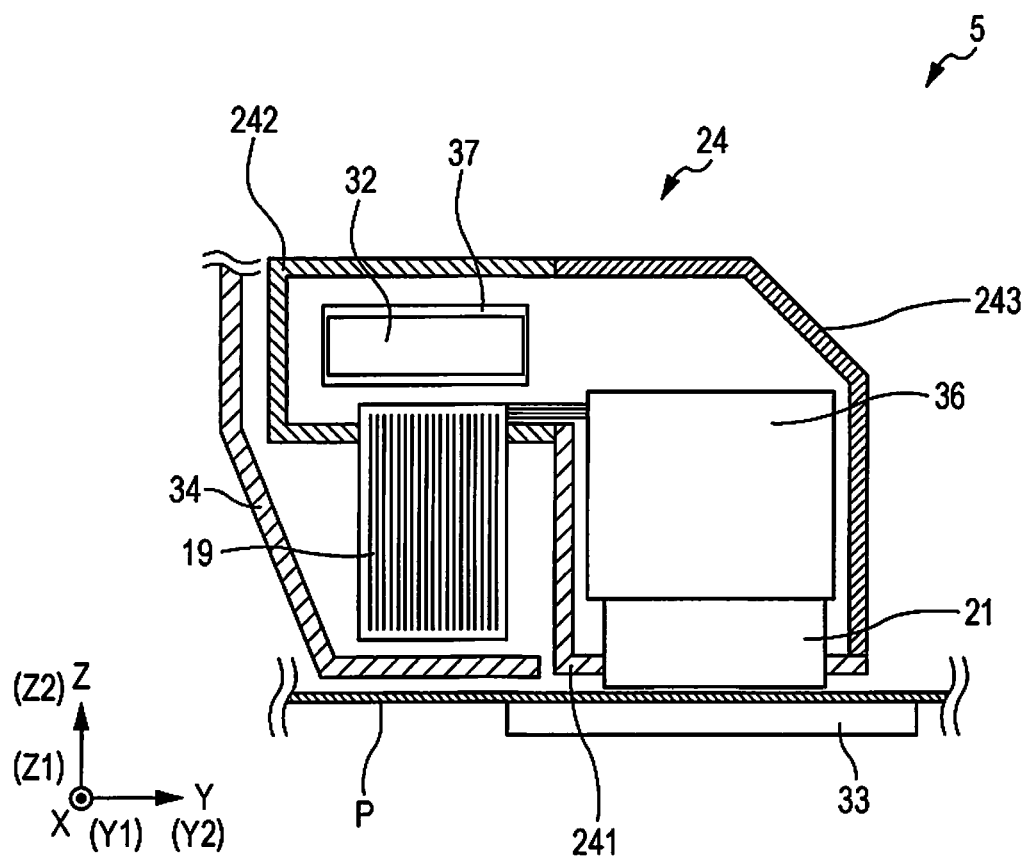
FIG. 15 is a diagram showing the internal configuration of the head unit when seen in the main scanning direction in the first embodiment.

A configuration of the printing unit 5 in the first embodiment will be described with reference to FIGS. 14 and 15. FIG. 14 is a view illustrating the configuration of the printing unit 5 when seen in the sub-scanning direction Y, and FIG. 15 is a view illustrating an internal configuration of the carriage 24 when seen in the main scanning direction X. In FIGS. 14 and 15, a side of the main scanning direction X where the control unit 10 is provided will be referred to as X1, and a side opposite thereto will be referred to as X2. An upstream side of the transporting direction of the printing medium P, which is the sub-scanning direction Y, will be referred to as Y1, and a downstream side will be referred to as Y2. A vertically lower side of the vertical direction Z will be referred to as Z1, and a vertically upper side will be referred to as Z2.

The printing unit 5 is configured so as to include the control unit 10, the head unit 20, the drive unit 30, the cables 19, the carriage guide shaft 32, a platen 33, a capping mechanism 35, and the maintenance mechanism 80.

The carriage guide shaft 32 is provided in the main scanning direction X and supports the head unit 20. That is, the head unit 20 moves (reciprocates) within an area of a movable region R along the carriage guide shaft 32 based on control by the carriage moving mechanism 41 (refer to FIG. 2).

The head unit 20 is configured so as to include the carriage 24 and the head 21 mounted on the carriage 24.

The carriage 24 includes a carriage main body 241 which has an L-shape when seen in the main scanning direction X, a carriage supporting unit 242 which is connected to the carriage guide shaft 32, and a carriage cover 243 which is included so as to make a closed space between the carriage main body 241 and the carriage supporting unit 242.

The carriage main body 241 is configured by the head 21 and a signal processing circuit substrate 36, on which a plurality of signal processing units (the control signal receiving unit 310, the control signal restoring unit 320, the selection control unit 210, and the selecting units 230 (refer to FIG. 2)) are mounted, being mounted.

The head 21 is mounted on the Z1 side of the carriage 24, and the nozzles 651 and the printing medium P are provided so as to oppose each other through an opening portion (not illustrated) of the carriage 24.

The signal processing circuit substrate 36 is provided on the Z2 side of the head 21 and is connected to the cables 19. The signal processing circuit substrate 36 generates the drive signal Vout in accordance with a plurality of signal processing units (the control signal receiving unit 310, the control signal restoring unit 320, the selection control unit 210, the selecting units 230, and the state signal generating unit 380 (refer to FIG. 2)), and outputs the signal to the head 21. The head 21 discharges an ink supplied from the ink storing unit 8 as ink droplets onto the printing medium P based on the input drive signal Vout.

The carriage supporting unit 242 is included on an upper (Z2 side) rear (Y1 side) portion of the carriage main body 241, and a front end portion thereof is fixed to the carriage main body 241.

The carriage supporting unit 242 has an insertion-hole 37. By inserting the carriage guide shaft 32 into the insertion-hole 37, the carriage supporting unit 242 is supported by the carriage guide shaft 32 along with the carriage main body 241. In addition, the cables 19 are inserted in the carriage supporting unit 242. The cables 19 are connected to the signal processing circuit substrate 36 mounted on the carriage main body 241 by going through the inside of the carriage supporting unit 242.

That is, by the carriage guide shaft 32 supporting the carriage 24, the head unit 20 moves (reciprocates) within the area of the movable region R along the carriage guide shaft 32 based on control by the carriage moving mechanism 41 (refer to FIG. 2).

The platen 33 is provided on a surface that is different from a surface of the printing medium P that opposes the head 21. A roller (not illustrated) that transports the printing medium P is provided on the platen 33, transports the printing medium P in the sub-scanning direction Y, and holds the printing medium P on the Z1 side when ink droplets are discharged on the printing medium P.

A home position is set on the X1 side of the platen 33. The home position is a starting point of movement (reciprocation) of the head unit 20, and the capping mechanism 35, which seals a nozzle formed surface of the head 21, is provided at the home position. In addition, the home position is also a position where the head unit 20 stands by when the liquid discharging apparatus 1 does not execute printing.

The maintenance mechanism 80 is provided on the X2 side of the platen 33. The maintenance mechanism 80 performs cleaning processing (pumping processing), in which thickened inks and bubbles in the discharging units 600 are suctioned by a tube pump (not illustrated), and wiping processing, in which foreign substances, such as paper dust stuck around the nozzles of the discharging units 600, are wiped off by a wiper, as maintenance processing. It is preferable that the execution of the maintenance processing be performed outside a printing region. Accordingly, unnecessary mist generated during executing maintenance processing sticks to the printing region (platen 33), and thereby a possibility that the printing medium P becomes dirty can be reduced.

The drive unit 30 is connected to the head unit 20 by the cable 19 (FFC 194). When seen horizontally with respect to a discharge surface in the sub-scanning direction Y, the drive unit 30 is provided outside the movable region R of the carriage 24 and is provided on an upper (Z2) side of the discharge surface, from which the head 21 discharges ink droplets onto the printing medium P, in the vertical direction Z. For example, the drive unit may be provided between the operation unit 7 and the ink storing unit 8 illustrated in FIG. 1.

By the drive unit 30 being included outside the movable region R of the carriage 24 and on the upper (Z2) side of the discharge surface in the vertical direction Z, the sticking of ink droplets discharged from the head unit 20 to the drive unit 30 is reduced. Accordingly, it is possible for the drive unit 30 to reduce the occurrence of a defect such as an insulation failure caused by sticking of ink droplets, and thus the reliability of the drive unit 30 can be improved.

The control unit 10 is connected to the drive unit 30 by the cable 19 (FFC 192 shown in FIG. 2). When seen horizontally with respect to the discharge surface in the sub-scanning direction Y, the control unit is provided outside the movable region R of the carriage 24 and is provided on a lower (Z1) side of the drive unit 30 in the vertical direction Z. For example, the control unit may be provided between the operation unit 7 and the ink storing unit 8 illustrated in FIG. 1.

By the control unit 10 being included outside the region where the carriage 24 moves, the sticking of ink droplets discharged from the head unit 20 to the control unit 10 is reduced. Accordingly, it is possible for the control unit 10 to reduce the occurrence of a defect such as an insulation failure caused by sticking of ink droplets, and thus the reliability of the control unit 10 can be improved.

By disposing the drive unit 30 at a position higher than the control unit 10, heat generated in the drive unit 30 convects to the Z2 side in the vertical direction Z. For this reason, it is possible to reduce an effect of the heat generated in the drive unit 30 on the control unit 10, and thus the occurrence of a breakdown (for example, a short life) of the control unit 10 due to the heat can be suppressed.

1.5 Configuration of Drive Unit and Drive Circuit Substrate

Figure 16:
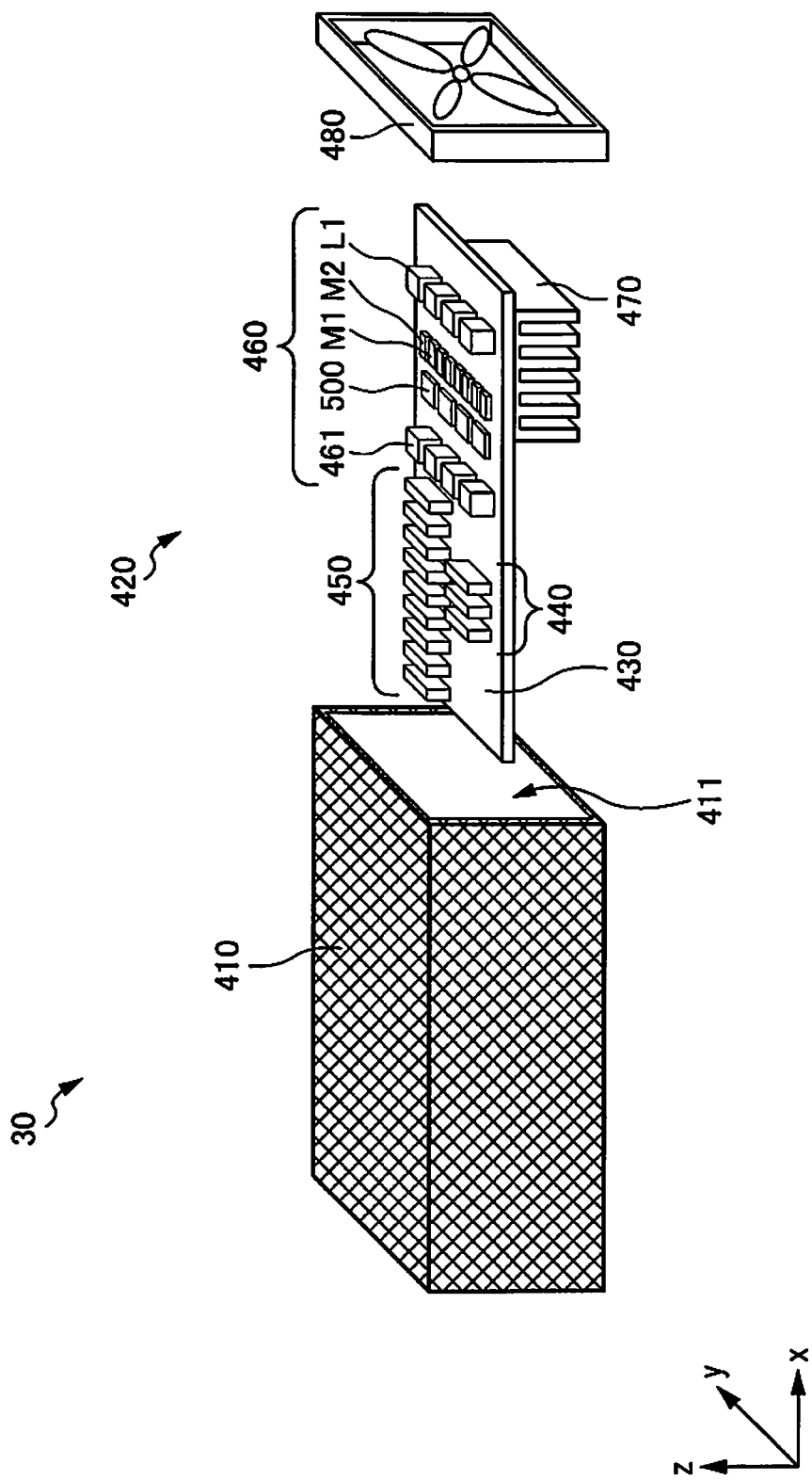
FIG. 16 is an exploded perspective view illustrating a configuration of a drive unit in the first embodiment.
Figure 17:
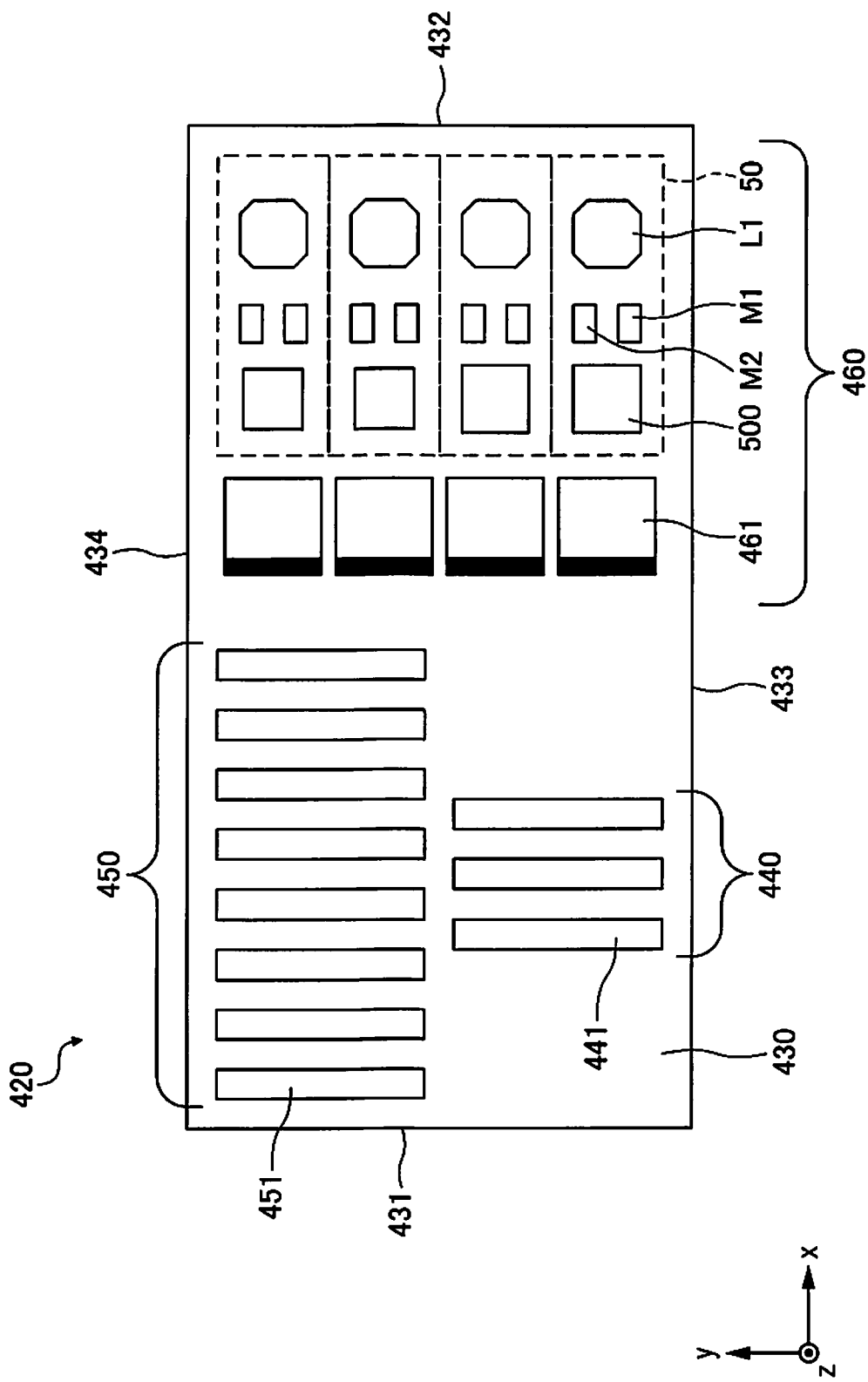
FIG. 17 is a schematic view illustrating layout of a drive circuit substrate in the first embodiment.

FIGS. 16 and 17 are views for illustrating a configuration of the drive unit 30. FIG. 16 is an exploded perspective view schematically illustrating the configuration of the drive unit 30, and FIG. 17 is a schematic view illustrating the layout of a drive circuit substrate 420 included in the drive unit 30. In FIGS. 16 and 17, a direction x, a direction y, and a direction z, which are orthogonal to each other, are illustrated and description will be given.

As illustrated in FIG. 16, the drive unit 30 is configured so as to include a case 410, the drive circuit substrate 420, a heat dissipating fin 470, and a heat dissipating fan 480.

The drive circuit substrate 420 (an example of a "drive circuit substrate") includes a substrate 430, and an input unit 440, an output unit 450, and a drive signal generating unit 460 are included on the substrate 430. The drive circuit substrate 420 will be described with reference to FIG. 17.

FIG. 17 is a schematic view illustrating the layout of the drive circuit substrate 420. The substrate 430 is substantially rectangular, and is formed of a short side 431 and a short side 432, which extend in the direction y and oppose each other, and a long side 433 and a long side 434, which extend in the direction x and oppose each other.

The input unit 440 is configured so as to include a plurality of (three in the first embodiment) connectors 441, which are arranged along the long side 433 from a short side 431 side to a short side 432 side. The cable 19 (FFC 192) (refer to FIG. 2) is connected to each of the plurality of connectors 441, and signals including the original drive differential signals dDSA and dDSB and a power supply voltage for operating the drive unit 30 are input from the control unit 10 into the each of the plurality of connectors.

For example, the cable 19 through which signals including the original drive differential signals dDSA and dDSB are transmitted may be connected to any one of the plurality of connectors 441, the cable 19 through which signals including a power supply voltage is transmitted may be connected to another of the connectors 441, and the cable 19 through which a ground electric potential is transmitted may be connected to still another of the connectors 441. The number of the connectors 441 included in the input unit 440 and input signals are not limited thereto.

In the first embodiment, signals input into the drive unit 30 are signals including the original drive differential signals dDSA and dDSB having weak voltages and a power supply voltage which is a high voltage for operating the drive unit 30. Therefore, it is possible to reduce mutual interference between transmitted signals by configuring the cable 19 and the connector 441 through which the original drive differential signals dDSA and dDSB having weak voltages are transmitted and the cable 19 and the connector 441 through which a power supply voltage that is a high voltage is transmitted of the different cables 19.

The output unit 450 is configured so as to include a plurality of (eight in the first embodiment) connectors 451, which are arranged along the long side 434 from the short side 431 side to the short side 432 side. The cable 19 (FFC 194) (refer to FIG. 2) is connected to each of the plurality of connectors 451, and signals including the drive signals COM-A and COM-B and the voltage VBS are output to the head unit 20.

For example, the cable 19 through which signals including the drive signal COM-A are transmitted may be connected to any one of the plurality of connectors 451, the cable 19 through which signals including the drive signal COM-B are transmitted may be connected to another of the connectors 451, and the cable 19 through which signals including the voltage VBS are transmitted may be connected to still another of the plurality of connectors 451.

In addition, for example, the cable 19 through which signals including the drive signal COM-A and the voltage VBS are transmitted may be connected to any one of the plurality of connectors 451, and the cable 19 through which signals including the drive signal COM-B and the voltage VBS are transmitted may be connected to another of the plurality of connectors 451.

The same signals may be transmitted through some of the plurality of cables 19 connected to the plurality of connectors 451. The number of the connectors 451 included in the output unit 450 and output signals are not limited thereto.

By the drive signals COM-A and COM-B output by the drive unit 30 increasing the number of the driven heads 21, an output current increases. For this reason, it is preferable that the cable 19 (FFC 194) be configured of a plurality of cables. Accordingly, it is possible to suppress an increase in the amount of a current flowing in one cable. Thus, it is possible to reduce stray resistance and stray inductance occurring in cables. As the cable 19 (FFC 194) is configured of a plurality of cables, a configuration where the plurality of connectors 451 are included in the output unit 450 is adopted.

The drive signal generating unit 460 is configured of a plurality of (four in the first embodiment) capacitors 461 and the plurality of (four in the first embodiment) drive circuits 50, and is provided on the short side 432 side of the substrate 430.

At this time, a distance between the connector 441 (an example of an "input connector") and the connector 451 (an example an "output connector") may be shorter than a distance between the drive circuit 50 and the connector 441, and the distance between the connector 441 and the connector 451 may be shorter than the distance between the drive circuit 50 and the connector 451. Specifically, on the substrate 430 of the drive circuit substrate 420, the input unit 440 including the connectors 441 and the output unit 450 including the connectors 451 are provided on the short side 431 side and the drive signal generating unit 460 including the drive circuit 50 is provided on the short side 432 side.

The plurality of drive circuits 50 are arranged along the short side 432 from the long side 433 side to the long side 434 side. The capacitor 461 on the short side 431 side is provided for each of the plurality of drive circuits 50. The plurality of capacitors 461 are provided so as to correspond to the plurality of drive circuits 50 respectively, and stabilize a power supply voltage supplied to each of the plurality of drive circuits 50.

Each of the drive circuits 50 is configured so as to include the integrated circuit device 500, the first transistor M1, the second transistor M2, and the inductor L1.

The inductors L1 are provided on the short side 432 side of the drive circuits 50. The first transistors M1 and the second transistors M2 are arranged in the direction y on the short side 431 side of the inductors L1. In addition, the integrated circuit devices 500 are also provided on the short side 431 side of the arranged first transistors M1 and the second transistors M2.

As described above (refer to FIG. 8), each of the drive circuits 50 generates a modulation signal obtained by the integrated circuit device 500 pulse-modulating the input drive data dA (or dB) and generates an amplified control signal based on the modulation signal. Then, the first transistor M1 and the second transistor M2 generate an amplified modulation signal obtained by amplifying the modulation signal based on the amplified control signal. In the low pass filter 560 including the inductor L1, the amplified modulation signal is demodulated and a drive signal is generated. That is, the integrated circuit device 500, the first transistor M1, the second transistor M2, and the inductor L1, which are included in the drive circuit 50, are provided such that the drive data dA (or dB) is input from the short side 431 side and the drive signal COM-A (COM-B) is output from the short side 432 side.

It is preferable that the same number of the drive circuits 50 that output the drive signal COM-A and the drive circuits 50 that output the drive signal COM-B be provided out of the plurality of drive circuits 50. In addition, it is preferable that the drive circuits 50 outputting the drive signal COM-A and the drive circuits 50 outputting the drive signal COM-B be alternately arranged along the short side 432 from the long side 433 side to the long side 434 side.

As described above, the drive circuit substrate 420 in the first embodiment converts the original drive differential signals dDSA and dDSB, which are input from the input unit 440 provided on the short side 431 side via the cable 19 (FFC 192), to the drive data pieces dA and dB by means of the drive data receiving unit 330 (not illustrated), and generates the drive signals COM-A and COM-B by means of the drive signal generating unit 460 provided on the short side 432 side. Then, the drive signals COM-A and COM-B are output from the output unit 450 provided on the short side 431 side through, for example, a different wiring layer of the substrate 430.

Referring back to FIG. 16, the heat dissipating fin 470 (an example of a "radiator") is provided on a surface that is different from a surface of the drive circuit substrate 420 on which the drive circuits 50 are provided, and is provided at a position where the drive circuits 50 and at least a part of the heat dissipating fin overlap each other when the drive circuit substrate 420 is seen in the direction z (an example of a "planar view").

Specifically, the heat dissipating fin 470 is provided on the back side of the drive circuit substrate 420, which is different from the front side where the drive circuits 50 are provided, and is provided such that the drive circuits 50 and at least a part of the dissipating fin overlap each other when seen in the direction z. At this time, it is preferable that the heat dissipating fin 470 be provided at a position where the first transistors M1 and the second transistors M2 of the drive circuits 50 and the heat dissipating fin overlap each other.

As described above (refer to FIG. 8), the drive signal COM-A (or COM-B) output from the drive circuit 50 is a signal obtained by the low pass filter 560 formed of the inductor L1 and the capacitor C1 smoothing out an amplified modulation signal at the connection point (terminal Sw) between the first transistor M1 and the second transistor M2. That is, when currents of the drive signals COM-A and COM-B output by the drive unit 30 increase, currents flowing in the first transistor M1, the second transistor M2, and the inductor L1 increase. For this reason, power loss in each of the first transistor M1, the second transistor M2, and the inductor L1 increases. That is the main cause of heat generation in the drive circuit 50.

In addition, surface-mount type transistors are often used as the first transistors M1 and the second transistors M2 of the drive circuits 50 in order to miniaturize the drive circuits 50. Heat generated in the first transistors M1 and the second transistors M2 is dissipated to the substrate 430, for example, by a heat spreader.

Therefore, the heat dissipating fin 470 can efficiently dissipate heat, which is dissipated to the substrate 430 by the first transistors M1 and the second transistors M2, by the heat dissipating fin 470 being provided at a position where the first transistors M1 and the second transistors M2 of the drive circuits 50 and the heat dissipating fin overlap each other. That is, according to the first embodiment, it is possible for the heat dissipating fin 470 to efficiently dissipate heat of the first transistors M1 and the second transistors M2.

The heat dissipating fan 480 (an example of a "fan") is provided at a position intersecting a direction where a plane of the drive circuit substrate 420 extends. A distance between the heat dissipating fan 480 and the drive circuit 50 is shorter than a distance between the heat dissipating fan 480 and the connector 441, and the distance between the heat dissipating fan 480 and the drive circuit 50 is shorter than a distance between the heat dissipating fan 480 and the connector 451.

Specifically, the heat dissipating fan 480 is provided on a drive circuit 50 side of the drive circuit substrate 420. Accordingly, it is possible for the heat dissipating fan 480 to efficiently cool the drive circuits 50 and the first transistors M1, the second transistors M2, and the inductors L1, which are mounted on the drive circuits 50. The heat dissipating fan 480 is provided so as to intersect a plane of the substrate 430 of the drive circuit substrate 420. Accordingly, it is possible to dissipate heat of both of the front side and the back side of the drive circuit substrate 420, and it is also possible to simultaneously cool, for example, heat of the heat dissipating fin 470 provided on the back side. Consequently, it is also possible to efficiently cool the first transistors M1 and the second transistors M2.

In the first embodiment, the drive circuits 50 are disposed on the short side 432 side of the drive circuit substrate 420, and the input unit 440 and the output unit 450 are disposed on the short side 431 side of the drive circuit substrate 420. It is preferable that the heat dissipating fan 480 be disposed on the short side 432 side of the drive circuit substrate 420. Accordingly, it is possible for air flow generated by the heat dissipating fan 480 to efficiently cool the drive circuits 50 without being obstructed by the input unit 440 and the output unit 450.

The heat dissipating fan 480 may be provided on the drive circuit 50 side of the drive circuit substrate 420, may be provided, for example, on the short side 432 side of the long side 433 illustrated in FIG. 17, or may be provided on the short side 432 side of the long side 434.

The case 410 (an example of a "drive circuit accommodating unit") has an opening portion 411 (an example of an "opening"), and accommodates the drive circuit substrate 420. In a state where the drive circuit substrate 420 is accommodated through the opening portion 411, a distance between the opening portion 411 and the drive circuit 50 is shorter than a distance between the opening portion 411 and the connector 441, and the distance between the opening portion 411 and the drive circuit 50 is shorter than a distance between the opening portion 411 and the connector 451. That is, in a state where the drive circuit substrate 420 is accommodated, the opening portion 411 is provided on a side where the drive circuits 50 of the drive circuit substrate 420 are mounted.

It is possible to efficiently dissipate heat by providing the opening portion 411 on the drive circuit 50 side where much heat is generated without the heat staying in the case 410.

In the first embodiment, the drive circuits 50 are disposed on the short side 432 side of the drive circuit substrate 420, and the input unit 440 and the output unit 450 are disposed on the short side 431 side of the drive circuit substrate 420. It is preferable that the opening portion 411 be disposed on the short side 432 side of the drive circuit substrate 420.

The opening portion 411 may be provided on the drive circuit 50 side of the drive circuit substrate 420, may be provided, for example, on the short side 432 side of the long side 433, or may be provided on the short side 432 side of the long side 434.

In the first embodiment, the drive circuit substrate 420 is accommodated in a closed space formed of the opening portion 411 and the heat dissipating fan 480. Accordingly, it is possible for the drive unit 30 to reduce sticking of ink droplets to the drive circuit substrate 420. The heat dissipating fin 470, the heat dissipating fan 480, and the opening portion 411 of the case 410 are provided on the side where the drive circuits 50 of the drive circuit substrate 420 are mounted. Therefore, the drive circuits 50 are efficiently cooled by the heat dissipating fin 470, the heat dissipating fan 480, and the opening portion 411 of the case 410 without being obstructed by the input unit 440 and the output unit 450. At this time, it is preferable to dispose the heat dissipating fan 480 such that heat generated inside the case 410 of the liquid discharging apparatus 1 is discharged to the outside of the liquid discharging apparatus 1. Accordingly, an effect of heat on a configuration other than the drive unit 30 can be reduced without heat generated in the drive unit 30 staying inside the liquid discharging apparatus 1. The stay of air flow generated by the heat dissipating fan 480 inside the liquid discharging apparatus 1 is reduced. Accordingly, it is possible for the liquid discharging apparatus 1 to perform stable discharging.

As described above, an efficient cooling by various cooling members (for example, the heat dissipating fan 480, the heat dissipating fin 470, and the opening portion 411) is possible by separately disposing the input unit 440 into which a signal is input, the output unit 450 from which a signal is output, and the drive signal generating unit 460, in which heat is generated, on the drive circuit substrate 420 of the drive unit 30 in the first embodiment. Therefore, according to the first embodiment, the drive unit 30 and the drive circuit substrate 420, which ensure a high degree of freedom of disposing the various cooling members, can be realized.

1.6 Operational Advantages

In the liquid discharging apparatus 1 according to the first embodiment, the distance between the input unit 440 and the output unit 450 is shorter than the distance between both of the input unit 440 and the output unit 450 and the drive circuit 50, on the drive circuit substrate 420 generating the drive signals COM-A and COM-B. That is, a region where the input unit 440 and the output unit 450 are disposed and a region where the drive circuits 50 generating heat are disposed are disposed in different regions on the drive circuit substrate 420. Accordingly, it is possible to dispose a cooling component provided on the drive circuits 50 generating heat without being restricted by the input unit 440 which inputs signals into the drive circuit 50 and the output unit 450 which outputs signals from the drive circuits 50. Therefore, it is possible to provide the liquid discharging apparatus 1, in which restriction of disposing the cooling component is reduced and a high degree of freedom of disposing the cooling component is ensured.

It is possible to optimally dispose the cooling component on the drive circuits 50, and it is possible to efficiently cool a heat generating component. It is possible to reduce an effect of heat generated in the drive circuits 50 on a peripheral configuration and an effect on discharge characteristics and the product life of the liquid discharging apparatus 1 can be reduced.

In the liquid discharging apparatus 1 according to the first embodiment, the heat dissipating fan 480 is included as a cooling device and the heat dissipating fan 480 is provided on the side where the drive circuits 50 are provided on the drive circuit substrate 420. Accordingly, it is possible for the heat dissipating fan 480 to efficiently cool the drive circuits 50 without being affected by the disposition of the input unit 440 and the output unit 450.

In the liquid discharging apparatus 1 according to the first embodiment, the heat dissipating fan 480 is provided so as to intersect a direction where the plane of the drive circuit substrate 420 extends. That is, it is possible to selectively cool both of or one of the front side and the back side of the drive circuit substrate 420, and it is possible to efficiently cool the drive circuit substrate 420.

In the liquid discharging apparatus 1 according to the first embodiment, the drive circuit substrate 420 may be accommodated in the case 410 having the opening portion 411. The sticking of a liquid discharged from the head 21 to the drive circuit substrate 420 is reduced by the case 410 accommodating the drive circuit substrate 420. Therefore, on the drive circuit substrate 420, the occurrence of a defect such as an insulation failure caused by a liquid discharged from the head 21 is reduced.

In the liquid discharging apparatus 1 according to the first embodiment, the opening portion 411 of the case 410 is provided on the drive circuit 50 side of the drive circuit substrate 420 so as to intersect the direction where the plane of the drive circuit substrate 420 extends. That is, heat generated in the drive circuits 50 is discharged to the outside of the case 410 from the opening portion 411, and thereby the stay of the heat inside the case 410 is reduced. Therefore, it is possible to efficiently cool the drive circuits 50.

In the liquid discharging apparatus 1 according to the first embodiment, the heat dissipating fin 470 is included as a cooling device and the heat dissipating fin 470 is provided on a surface, which is different from a surface of the drive circuit substrate 420 on which the drive circuits 50 are provided, and is provided so as to overlap the drive circuits 50. That is, the heat dissipating fin 470 dissipates heat generated in the drive circuits 50 from a surface of the drive circuit substrate 420 on which the drive circuits 50 are not provided. Accordingly, it is possible to efficiently dissipate heat generated in the drive circuits 50.

As described above, it is possible to cool the drive circuits 50 by separately disposing the input unit 440 into which a signal is input, the output unit 450 from which a signal is output, and the drive signal generating unit 460, in which heat is generated, on the drive circuit substrate 420 of the drive unit 30 in the first embodiment without the various cooling members (for example, the heat dissipating fan 480, the heat dissipating fin 470, and the opening portion 411) receiving effects of the input unit 440 and the output unit 450. Therefore, it is possible to realize the drive unit 30 and the drive circuit substrate 420, which ensure a high degree of freedom of disposing the various cooling members.

2 Second Embodiment

Although the liquid discharging apparatus 1 according to a second embodiment has the same configuration as the liquid discharging apparatus 1 according to the liquid discharging apparatus 1, the layout of the drive signal generating unit 460 of the drive circuit substrate 420 included in the drive unit 30 is different. Hereinafter, description on the contents overlapping the first embodiment will be omitted or simplified, and contents different from the first embodiment will be mainly described.

Figure 18:
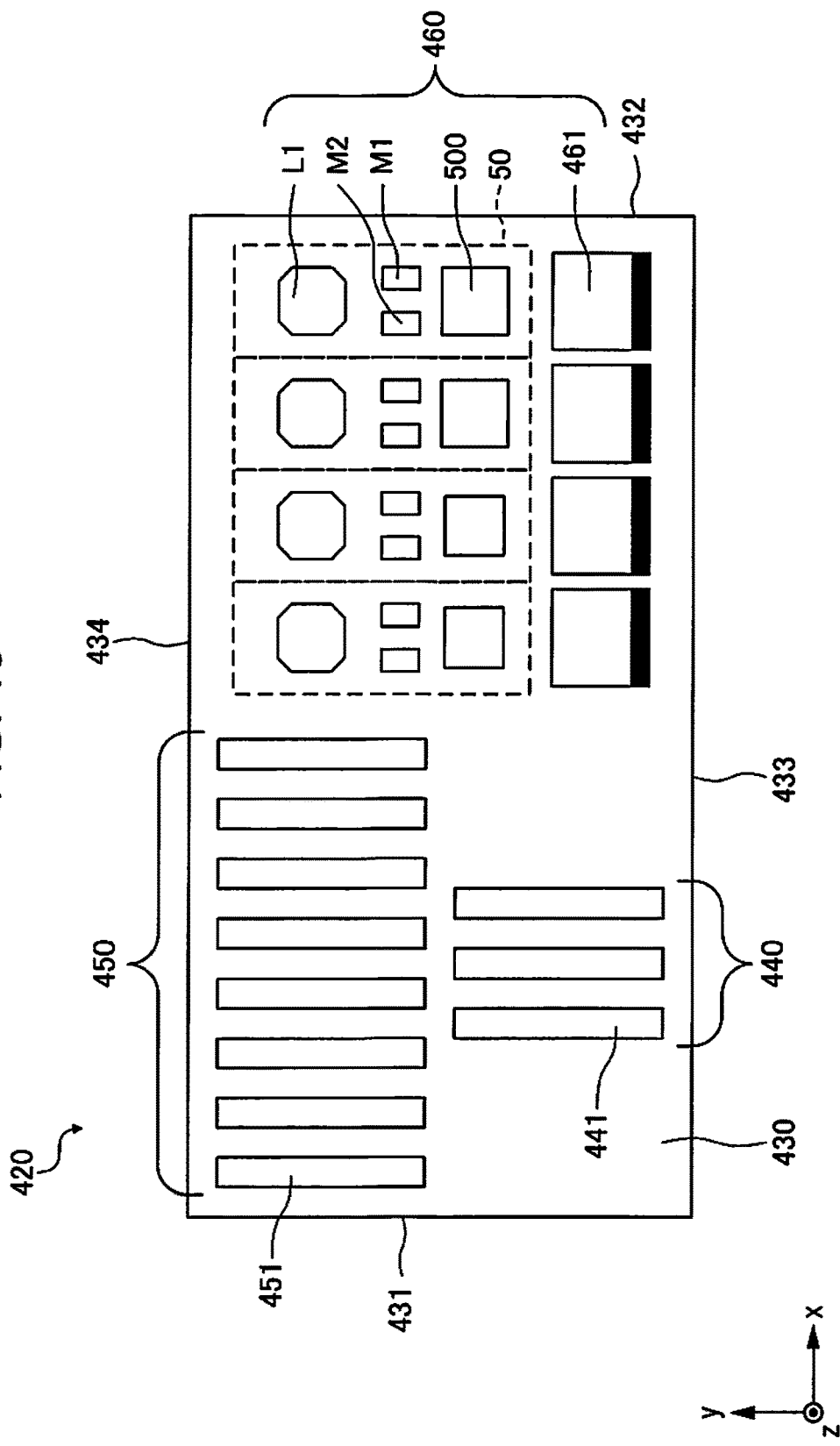
FIG. 18 is a schematic view illustrating layout of a drive circuit substrate in a second embodiment.

FIG. 18 is a schematic view illustrating the layout of the drive circuit substrate 420 according to the second embodiment. In FIG. 18, the direction x, the direction y, and the direction z, which are orthogonal to each other, are illustrated and description will be given.

The liquid discharging apparatus 1 according to the second embodiment has the same configuration as the liquid discharging apparatus 1 according to the first embodiment, and illustration and description thereof will be omitted (FIG. 1). The liquid discharging apparatus 1 according to the second embodiment has the same electrical configuration as the first embodiment, and illustration and description thereof will be omitted (FIG. 2). The configuration of the head 21, the configuration of a drive signal, and the operation of the drive circuits 50 of the liquid discharging apparatus 1 according to the second embodiment are the same as in the first embodiment, and illustration and description thereof will be omitted (FIGS. 3 to 13). In addition, the configuration of the printing unit 5 of the liquid discharging apparatus 1 according to the second embodiment is the same as in the first embodiment, and illustration and description thereof will be omitted (FIGS. 14 and 15).

As in the first embodiment, the drive unit 30 according to the second embodiment is configured so as to include the case 410, the drive circuit substrate 420, the heat dissipating fin 470, and the heat dissipating fan 480 (refer to FIG. 16).

FIG. 18 is a schematic view illustrating the layout of the drive circuit substrate 420 according to the second embodiment. The substrate 430 is substantially rectangular, and is formed of the short side 431 and the short side 432, which extend in the direction y and oppose each other, and the long side 433 and the long side 434, which extend in the direction x and oppose each other.

As in the first embodiment, the input unit 440 is configured so as to include the plurality of (three in the second embodiment) connectors 441, which are arranged along the long side 433 from the short side 431 side to the short side 432 side. The cable 19 (FFC 192) is connected to each of the plurality of connectors 441, and signals including the original drive differential signals dDSA and dDSB and a power supply voltage for operating the drive unit 30 are input from the control unit 10 into the each of the plurality of connectors.

As in the first embodiment, the output unit 450 is configured so as to include the plurality of (eight in the second embodiment) connectors 451, which are arranged along the long side 434 from the short side 431 side to the short side 432 side. The cable 19 (FFC 194) is connected to each of the plurality of connectors 451, and signals including the drive signals COM-A and COM-B and the voltage VBS are output to the head unit 20.

The drive signal generating unit 460 is configured of a plurality of (four in the second embodiment) capacitors 461 and the plurality of (four in the second embodiment) drive circuits 50, and is provided near the short side 432 of the substrate 430.

The plurality of drive circuits 50 are arranged along the long side 434 from the short side 432 side to the short side 431 side. The capacitor 461 on the long side 433 side is provided for each of the plurality of drive circuits 50. The plurality of capacitors 461 are provided so as to correspond to the plurality of drive circuits 50 respectively, and stabilize a power, supply voltage supplied to each of the plurality of drive circuits 50.

As in the first embodiment, each of the drive circuits 50 is configured so as to include the integrated circuit device 500, the first transistor M1, the second transistor M2, and the inductor L1.

The inductors L1 are provided on the long side 434 side of the drive circuits 50. The first transistors M1 and the second transistors M2 are arranged in the direction x on the long side 433 side of the inductors L1. In addition, the integrated circuit devices 500 are also provided on the long side 433 side of the arranged first transistors M1 and the second transistors M2.

That is, the integrated circuit device 500, the first transistor M1, the second transistor M2, and the inductor L1, which are included in the drive circuit 50, are provided such that the drive data dA (or dB) is input from the long side 433 side and the drive signal COM-A (COM-B) is output to the long side 434 side.

As in the first embodiment, it is preferable that the same number of the drive circuits 50 that output the drive signal COM-A and the drive circuits 50 that output the drive signal COM-B be provided out of the plurality of drive circuits 50. In addition, it is preferable that the drive circuits 50 outputting the drive signal COM-A and the drive circuits 50 outputting the drive signal COM-B be alternately arranged along the long side 433 from the short side 432 side to the short side 431.

As described above, in the drive circuit substrate 420 in the second embodiment, the original drive differential signals dDSA and dDSB, which are input from the input unit 440 provided on the short side 431 side of the long side 433 via the cable 19 (FFC 192), are input into the drive signal generating unit 460 provided along the long side 433 on the short side 432 side.

The original drive differential signals dDSA and dDSB input in the drive signal generating unit 460 are converted to the drive data pieces dA and dB by the drive data receiving unit 330 (not illustrated), and the drive signals COM-A and COM-B are generated by the drive signal generating unit 460. Then, the drive signals COM-A and COM-B are output from the output unit 450 provided along the long side 434 on the short side 431 side of the long side 434. That is, in the second embodiment, it is possible to perform wiring such that the weak original drive differential signals dDSA and dDSB and the drive signals COM-A and COM-B on the substrate 430 are not mixed with the original drive differential signals crossing the drive signals. Therefore, it is possible to reduce interference between signals transmitted by the drive circuit substrate 420.

Accordingly, it is possible for the drive unit 30 to improve a degree of freedom of disposing the cooling members for cooling without deteriorating the accuracy of signals transmitted by the drive circuit substrate 420.

3 Modification Example

Although a piezoelectric liquid discharging apparatus in which a drive circuit drives a piezoelectric element (capacitive load) as a driving element is given as an example in the embodiment described above, the invention is also applicable to a liquid discharging apparatus in which a drive circuit drives a driving element other than a capacitive load. As an example of such a liquid discharging apparatus, a thermal (bubble type) liquid discharging apparatus, in which a drive circuit drives a heater element (for example, a resistance) as a driving element and a liquid is discharged using bubbles generated by the heater element being heated, can be given.

Although a printing apparatus such as a printer is given as an example of a liquid discharging apparatus in the embodiments described above, the invention may be a liquid discharging apparatus that discharges a liquid onto a medium having a size of A3 or larger, and is also applicable to liquid discharging apparatuses including a color material discharging apparatus used in manufacturing color filters, such as a liquid crystal display, an electrode material discharging apparatus used in forming electrodes, such as an organic EL display and a field emission display (FED), a bioorganic material discharging apparatus used in manufacturing biochips, a three-dimensional modelling apparatus (so-called 3D printer), and a textile printing apparatus.

Although the embodiments described above or the modification example has been described, the invention is not limited to the embodiments or the modification example, and can be carried out in various forms without departing from the spirit of the invention. For example, the embodiments and each modification example described above can be combined as appropriate.

The invention includes practically the same configuration (for example, a configuration of which a functions, a method, and a result are the same or a configuration of which an object and an advantage are the same) as the configuration described in the embodiments. The invention includes a configuration where an inessential portion of the configuration described in the embodiments is substituted. The invention includes a configuration with which the same operational advantages described in the embodiments are achieved or a configuration with which the same object can be accomplished. In addition, the invention includes a configuration where a known technique is added to the configuration described in the embodiments.

The entire disclosure of Japanese Patent Application No. 2017-056643, filed Mar. 22, 2017 is expressly incorporated by reference herein.

What is claimed is:

1. A liquid discharging apparatus comprising:
   a print head that includes a driving element and discharges a liquid when a drive signal is applied and the driving element is driven;
   a drive signal generation circuit that generates the drive signal based on a drive signal generation control signal for controlling generation of the drive signal; and
   a drive circuit substrate on which the drive signal generation circuit is provided,
   the drive circuit substrate including
      an input connector that is electrically connected with a first flexible flat cable and inputs the drive signal generation control signal into the drive circuit substrate, and
      an output connector that is electrically connected with a second flexible flat cable which is different from the first flexible flat cable and outputs the drive signal generated by the drive signal generation circuit to the driving element,
   wherein a distance between the input connector and the output connector is shorter than both of a distance between the drive signal generation circuit and the input connector, and a distance between the drive signal generation circuit and the output connector,
   a position of the input connector in a first direction does not overlap a position of the drive signal generation circuit in the first direction,
   a position of the output connector in the first direction does not overlap the position of the drive signal generation circuit in the first direction,
   a position of the input connector in a second direction which crosses the first direction is different from a position of the output connector in the second direction, and
   a position of the input connector in the first direction at least partly overlaps the position of the output connector in the first direction.

2. The liquid discharging apparatus according to claim 1, further comprising:
   a fan,
   wherein the fan is provided at a position intersecting an extending direction where a plane of the drive circuit substrate extends,
   a distance between the fan and the drive signal generation circuit is shorter than a distance between the fan and the input connector, and
   the distance between the fan and the drive signal generation circuit is shorter than a distance between the fan and the output connector.

3. The liquid discharging apparatus according to claim 2,
   a longitudinal plane of the drive circuit substrate extends in a first direction, and
   the fan is provided along a second direction which crosses the first direction.

4. The liquid discharging apparatus according to claim 1, further comprising:
   a drive circuit accommodating unit that accommodates the drive circuit substrate and has an opening,
   wherein the opening is provided at a position intersecting an extending direction where a plane of the drive circuit substrate extends,
   a distance between the opening and the drive signal generation circuit is shorter than a distance between the opening and the input connector, and
   the distance between the opening and the drive signal generation circuit is shorter than a distance between the opening and the output connector.

5. The liquid discharging apparatus according to claim 1, further comprising:
a radiator,
the radiator is provided on a surface of the drive circuit substrate, which is different from a surface on which the drive signal generation circuit is provided, and
in planar view of the drive circuit substrate, the drive signal generation circuit and the radiator are provided at positions where at least a part of the drive signal generation circuit and a part of the radiator overlap each other.

6. The liquid discharging apparatus according to claim 1, wherein the drive signal generation control signal is a digital signal,
the drive signal generation circuit generates an underlying drive signal, which is an underlying analog signal of the drive signal, based on the drive signal generation control signal, and
the drive signal generation circuit power-amplifies the underlying drive signal to generate the drive signal.

7. The liquid discharging apparatus according to claim 1, wherein the drive circuit substrate includes a capacitor, a transistor and an inductor.

8. The liquid discharging apparatus according to claim 1, wherein
the first direction extends along a long side of the drive circuit substrate, and the second direction extends along a short side of the drive circuit substrate.

9. The liquid discharging apparatus according to claim 1, wherein
the drive circuit substrate includes a plurality of input connectors including the input connector, and a plurality of output connectors including the output connector, a number of the input connectors is less than a number of the output connectors.

10. The liquid discharging apparatus according to claim 9, wherein
the input connectors are aligned along the first direction, and
the output connectors are aligned along the first direction.

11. A circuit substrate comprising:
an input connector that is electrically connected with a first flexible flat cable;
a drive signal generation circuit that generates a drive signal for driving a driving element based on a drive signal generation control signal inputted through the input connector; and
an output connector that is electrically connected with a second flexible flat cable which is different from the first flexible flat cable and outputs the drive signal generated by the drive signal generation circuit to the driving element,
wherein a distance between the input connector and the output connector is shorter than both of a distance between the drive signal generation circuit and the input connector, and a distance between the drive signal generation circuit and the output connector,
a position of the input connector in a first direction does not overlap a position of the drive signal generation circuit in the first direction,
a position of the output connector in the first direction does not overlap the position of the drive signal generation circuit in the first direction,
a position of the input connector in a second direction which crosses the first direction is different from a position of the output connector in the second direction, and
a position of the input connector in the first direction at least partly overlaps the position of the output connector in the first direction.

12. The circuit substrate according to claim 11, wherein the position of the input connector in the first direction and the position of the output connector in the first direction are located on a same side with respect to the drive signal generation circuit.

13. The circuit substrate according to claim 11, further comprising:
a capacitor;
a transistor; and
an inductor.

14. The liquid discharging apparatus according to claim 11, wherein
the first direction extends along a long side of the drive circuit substrate, and the second direction extends along a short side of the drive circuit substrate.

15. The liquid discharging apparatus according to claim 11, wherein
the drive circuit substrate includes a plurality of input connectors including the input connector, and a plurality of output connectors including the output connector, a number of the input connectors is less than a number of the output connectors.

16. The liquid discharging apparatus according to claim 15, wherein
the input connectors are aligned along the first direction, and
the output connectors are aligned along the first direction.

17. A liquid discharging apparatus comprising:
a print head that includes a driving element and discharges a liquid when a drive signal is applied and the driving element is driven;
a drive signal generation circuit that generates the drive signal based on a drive signal generation control signal for controlling generation of the drive signal;
a drive circuit substrate on which the drive signal generation circuit is provided; and
a radiator,
the drive circuit substrate including
an input connector that inputs the drive signal generation control signal into the drive circuit substrate, and
an output connector that outputs the drive signal from the drive circuit substrate,
a distance between the input connector and the output connector being shorter than a distance between the drive signal generation circuit and the input connector,
the distance between the input connector and the output connector being shorter than a distance between the drive signal generation circuit and the output connector,
the radiator being provided on a surface of the drive circuit substrate, which is different from a surface on which the drive signal generation circuit is provided, and
in planar view of the drive circuit substrate, the drive signal generation circuit and the radiator being provided at positions where at least a part of the drive signal generation circuit and a part of the radiator overlap each other.

* * * * *